(12) United States Patent
Segev et al.

(10) Patent No.: US 11,283,244 B2
(45) Date of Patent: Mar. 22, 2022

(54) TOPOLOGICAL INSULATOR LASER SYSTEM

(71) Applicants: TECHNION RESEARCH AND DEVELOPMENT FOUNDATION LTD., Technion (IL); THE UNIVERSITY OF CENTRAL FLORIDA RESEARCH FOUNDATION, INC., Orlando, FL (US)

(72) Inventors: Mordechai Segev, Haifa (IL); Gal Harari, Tel Aviv Yafo (IL); Demetrios N. Christodoulides, Casselberry, FL (US); Miguel Angel Bandres Motola, Haifa (IL)

(73) Assignees: TECHNION RESEARCH AND DEVELOPMENT FOUNDATION, LTD., Haifa (IL); THE UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 237 days.

(21) Appl. No.: 16/499,922

(22) PCT Filed: Mar. 29, 2018

(86) PCT No.: PCT/IL2018/050375
§ 371 (c)(1),
(2) Date: Oct. 1, 2019

(87) PCT Pub. No.: WO2018/185749
PCT Pub. Date: Oct. 11, 2018

(65) Prior Publication Data
US 2020/0119524 A1   Apr. 16, 2020

Related U.S. Application Data

(60) Provisional application No. 62/624,196, filed on Jan. 31, 2018, provisional application No. 62/480,604, filed on Apr. 3, 2017.

(51) Int. Cl.
*H01S 5/40*  (2006.01)
*G02B 6/122*  (2006.01)
(Continued)

(52) U.S. Cl.
CPC ............ *H01S 5/405* (2013.01); *G02B 6/1225* (2013.01); *H01S 5/02251* (2021.01);
(Continued)

(58) Field of Classification Search
CPC .. H01S 5/405; H01S 5/02251; H01S 5/34333; H01S 5/11; H01S 5/041; H01S 5/1071; H01S 2301/166; G02B 6/1225
See application file for complete search history.

(56) References Cited

U.S. PATENT DOCUMENTS 9,052,448 B2   6/2015   Hafezi et al.
2008/0123701 A1   5/2008   He
(Continued)

FOREIGN PATENT DOCUMENTS

GB   2384617 A   7/2003
WO   2017066095 A1   4/2017

OTHER PUBLICATIONS

Gal Harari et al: "Topological lasers", Conference on Lasers and Electro-Optics (CLEO), OSA, Jun. 5, 2016, pp. 1-2.
(Continued)

*Primary Examiner* — Yuanda Zhang
(74) *Attorney, Agent, or Firm* — Browdy and Neimark, PLLC

(57) ABSTRACT

A topological laser system is described. The laser system comprises an array of optical elements arranged in an array and coupled between them such that the array is configured for supporting one or more topological modes. The plurality of optical elements comprises optical elements carrying gain material configured for emitting optical radiation in response
(Continued)

to pumping energy. The laser system further comprises a pumping unit configured to provide pumping of a group of the optical elements of the array within at least a portion of the spatial region corresponding with said topological mode; and at least one output port optically coupled to one or more of the optical elements associated with said topological mode. The at least one output ports is configured for extracting a portion of light intensity from said laser system.

21 Claims, 13 Drawing Sheets

(51) Int. Cl.
  *H01S 5/04*  (2006.01)
  *H01S 5/10*  (2021.01)
  *H01S 5/11*  (2021.01)
  *H01S 5/343*  (2006.01)
  *H01S 5/02251*  (2021.01)

(52) U.S. Cl.
  CPC ............ *H01S 5/041* (2013.01); *H01S 5/1071* (2013.01); *H01S 5/11* (2021.01); *H01S 5/34333* (2013.01); *H01S 2301/166* (2013.01)

(56) References Cited

U.S. PATENT DOCUMENTS

| | | | |
|---|---|---|---|
| 2014/0070082 A1* | 3/2014 | Guo | G01N 21/59 |
| | | | 250/227.14 |
| 2018/0067182 A1* | 3/2018 | Clerk | G01R 33/4802 |
| 2019/0157572 A1* | 5/2019 | Koch | C09K 19/3861 |

OTHER PUBLICATIONS

M. Hafezi et al., "Imaging topological edge states in silicon photonics", Nature Photonics, vol. 7, No. 12, Oct. 20, 2013, pp. 1001-1005.

S. Wittek et al., "Towards the experimental realization of the topological insulator laser", Conference on Lasers and Electro-Optics (CLEO), The Optical Society, May 14, 2017, pp. 1-2.

Bahari et al., "Nonreciprocal lasing in topological cavities of arbitrary geometries", Science, vol. 358, No. 6363, Oct. 12, 2017, pp. 636-640.

Miguel A. Bandres et al., "Topological insulator laser: Experiments", Science, vol. 359, No. 6381, Feb. 1, 2018, p. eaar4005 & Miguel A. Bandres et al., "Supplementary Materials for Topological insulator laser: Experiments", Science, vol. 359, No. 6381, Mar. 16, 2018, pp. 1-17.

Gal Harari et al., "Topological insulator laser: Theory", Science, vol. 359, No. 6381, Feb. 1, 2018, p. eaar4003.

Longhi S. et al., "Robust light transport in non-Hermitian photonic lattices", Scientific reports 5, Article No. 13376, Aug. 28, 2015.

M. Milicevic et al., "Edge states in polariton honeycomb lattices", 2D Materials, vol. 2, No. 3, Aug. 6, 2015.

Tomoki Ozawa et al., "Topological photonics", Optics; Mesoscale and Nanoscale Physics; Quantum Gases; Quantum Physics, Feb. 12, 2018.

Miguel A Bandres et al., "Topological insulator laser: Experiments", Research Article, Science Feb. 1, 2018—Abstract.

Gal Harari et al., "Topological insulator laser: Theory", Research Article, Science Feb. 1, 2018—Abstract.

* cited by examiner

FIG. 7A
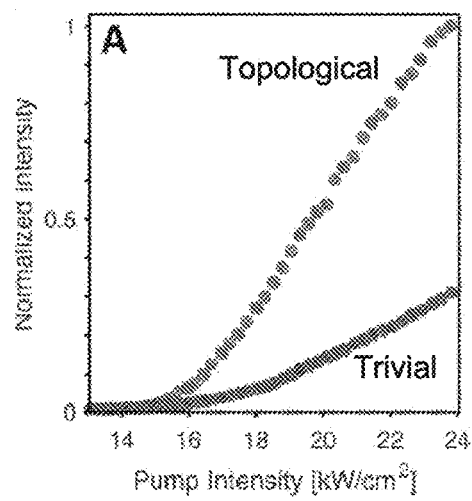
FIG. 7B
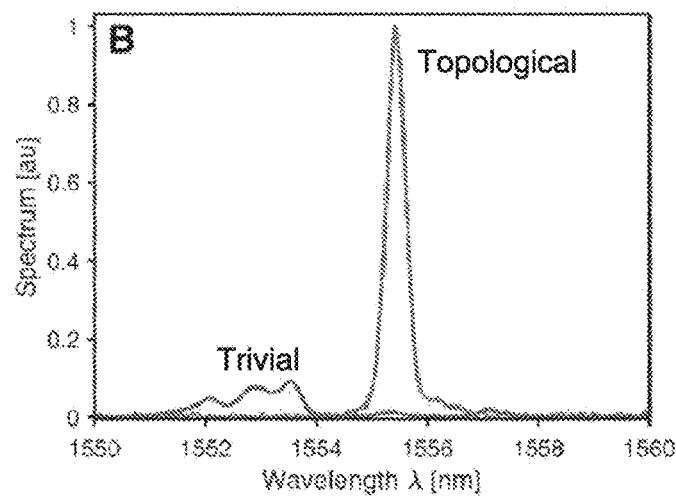
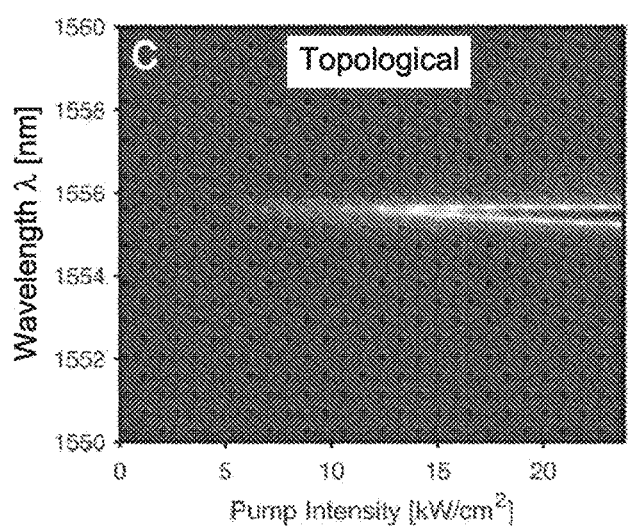
FIG. 7C
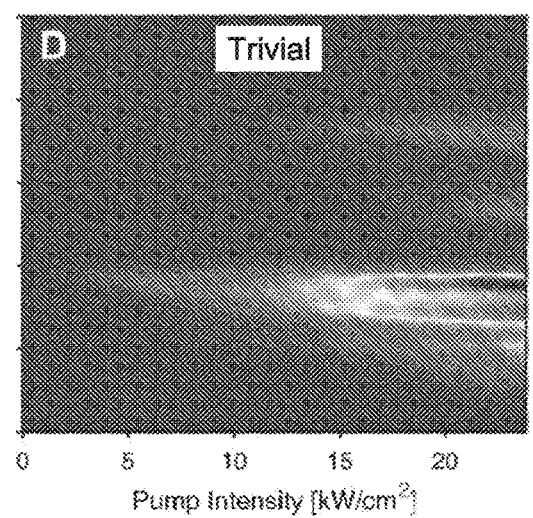
FIG. 7D

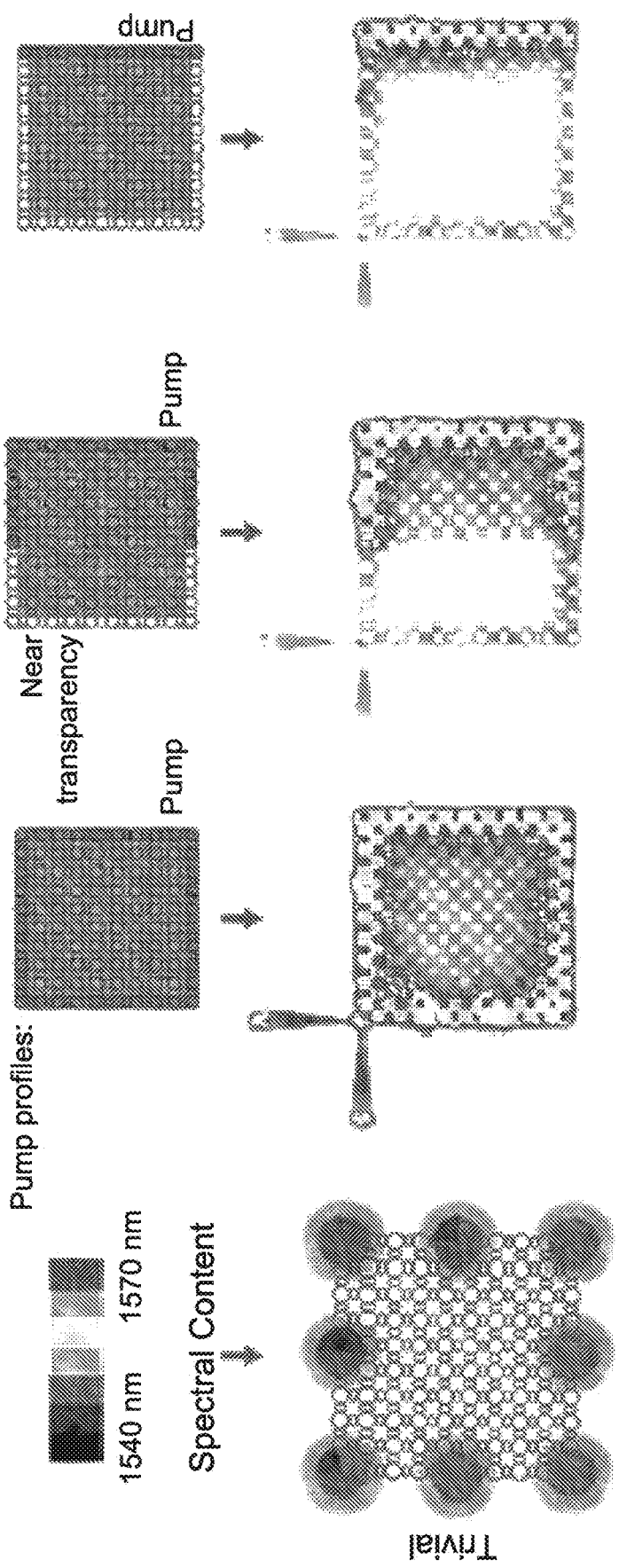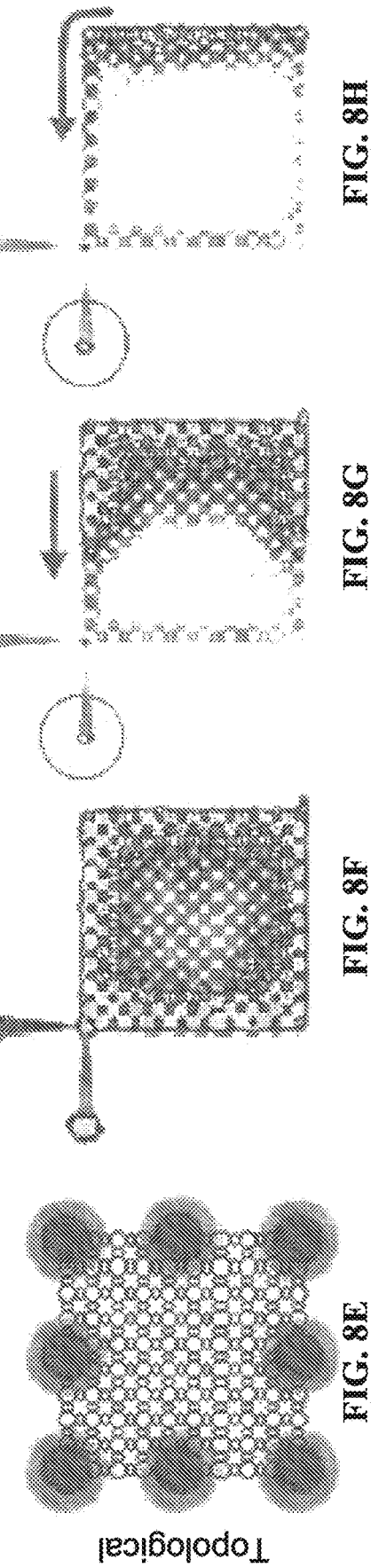
FIG. 8A FIG. 8B FIG. 8C FIG. 8D
FIG. 8E FIG. 8F FIG. 8G FIG. 8H

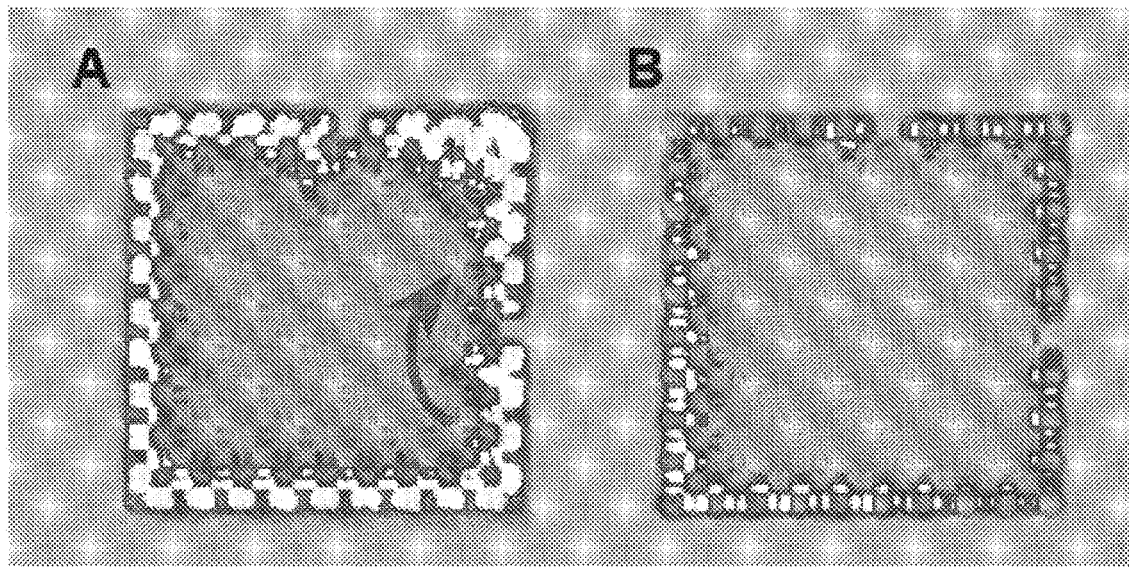
FIG. 9A  FIG. 9B
FIG. 10A  FIG. 10B
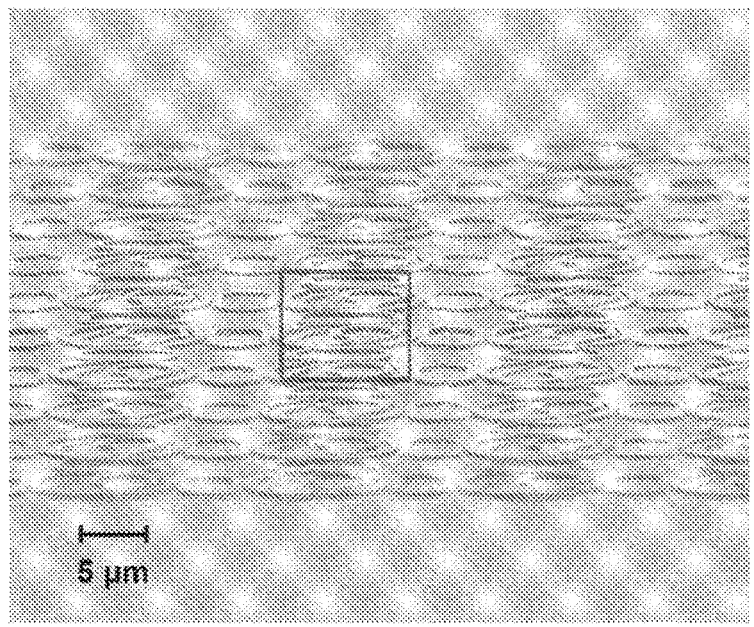
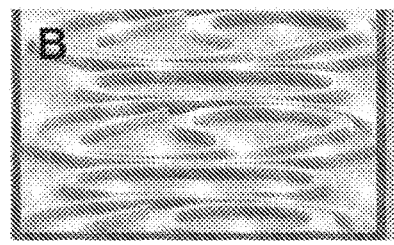
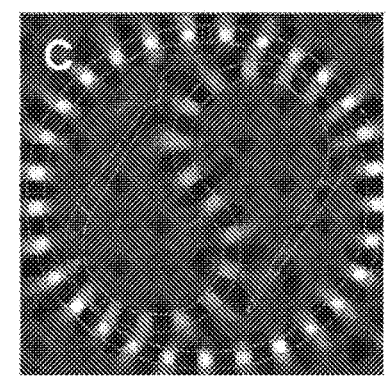
FIG. 10C

TOPOLOGICAL INSULATOR LASER SYSTEM

TECHNOLOGICAL FIELD

The present invention is in the field of laser systems and is relevant to laser systems including arrays of gain elements. The invention relates in particular to laser system utilizing photonic topological states for selected lasing modes.

BACKGROUND

Diode lasers (also known as semiconductor lasers) are the most commonly used lasers system, with applications ranging from optical telecommunications to compact disks and much more. The gain in semiconductor lasers is high (in terms of gain per unit length), but the power emitted from a single semiconductor laser is limited, and generally does not exceed a few Watts. Extensive research is and has been carried out to develop arrays of semiconductor lasers, where neighboring emitters are coupled to one another, with the goal to overcome the power limitation of a single element and the critical damage limitations, while maintaining a narrow spectrum and a stable emission field that is robust against variations in pumping power, fabrication defects and disorder. In principle, laser array structures are capable of providing high laser power. However, such laser array structures tend to provide emission with many spatial and spectral modes simultaneously, where the modal structure of the laser array system (near field and spectrum) vary with the pumping strength, thereby greatly reducing the coherence properties of the laser and the stability to variations in the pumping and environmental conditions. Likewise, when the number of laser elements is increased, the coherence between emitters far apart from one another is greatly reduced. Despite many methods suggested to control the emission pattern of laser diode arrays, current technology is still not able to produce laser array systems operating as a single high power coherent laser source. Consequently, the most common application of laser array systems is as pump modules (instead of flashtubes) for solid state lasers.

Topological insulators are phases of matter characterized by topological states (typically edge states) having spatial configuration/path that is stable and robust to local variations. In the past decade, the principles of topological insulators have been demonstrated in various physical systems, ranging from photonics and microwaves to acoustics, mechanics and cold atoms. Specifically, with electromagnetic waves, topological insulators have been demonstrated in in systems of coupled elements, such waveguides or resonators. In general, the scientific understanding considers that to support topological modes within a system, the system need to be such that can be represented as Hermitian system, i.e. a passive system that contain no gain. Adding gain to topological insulators (in all systems) makes the system non-Hermitian, which was believed to break the topological properties, specifically to break the topological protection of transport in the system, rendering the system susceptible to defects and imperfections.

U.S. Pat. No. 9,052,448 describes two-dimensional coupled resonator optical waveguide arrangements and systems, devices, and methods thereof. Networks of coupled resonator optical waveguides are arranged so as to exploit topological properties of these optical networks. Such arrangement affords topological protection against disorders or perturbations in the network that may hinder or block photon flow. As a result of a disorder, photons traversing along edge states of the array are rerouted based on the disorder or perturbation. Photon routing in the network is accordingly protected against disorder or defects.

GENERAL DESCRIPTION

There is a need in the art for novel laser array configuration enabling emission of coherent optical radiation while maintaining stable single-mode emission at high pumping powers. Further, there is need for laser array configuration having robust emission with respect to variations in environment, defects, fabrication imperfections, and changes in pumping power.

The present invention provides a topological insulator laser system configured with an array of optical elements arranged to be coupled between them. The optical elements of the array include optical elements carrying selected gain material and configured to provide emission in one or more wavelength ranges in response to pumping energy. The arrangement of the optical elements in the array and the coupling levels between the optical elements are selected such that the array supports one or more topological modes associated with spatial configuration of the array. More specifically, the spatial arrangement and coupling parameters provide one or more topologically stable modes having certain spatial path. The laser system further includes a pumping unit configured to provide pumping energy (e.g. optical and/or electrical pumping) directed onto a group of optical elements associated with at least a portion of the spatial region of the topological mode, and an output port optically coupled to one or more optical elements of the array to provide extraction of a portion of the power from said laser system. Generally, to provide efficient out coupling of light, the output port is preferably coupled to one or more optical elements located along trajectory of the topological modes. Typically, such one or more optical elements are located at edges of the array.

Topological insulators are well known in electronic solid-state systems. In such systems, the bulk of solid-state element is an insulator having an energy gap between electronic valance states and conducting states. Topologically conducting surface states are special states that fall within the bulk energy gap and allow electrical conduction along surface of the bulk, by allowing electrons/holes to shift between states having small energetic difference. A substantially similar effect may occur in photonic devices formed by coupled optical elements such as resonators, waveguides etc. that are arranged in one- two-or three-dimensional arrays. Optical coupling between elements of the array gives rise to crystal-like behavior supporting optical modes and defining certain band structure (as in photonic crystals). Given the spatial arrangement and properties of the optical elements of the array, the band structure of the system and the wavefunctions of the various photonic states are determined, and can be calculated using various known techniques. Further, various configurations of arrays of optical elements supporting topological edge modes are described herein in more details below.

In some configuration, the array of optical elements may be a two-dimensional array including a plurality of optical elements (e.g. optical resonators or ring/oval resonators) arranged at selected arrangement. The optical elements of the array are optically coupled between them allowing light components to be transferred from one element to its neighboring elements. Arrangement of the array provides that coupling between optical elements of different rows (or columns) of the array applies certain phase variation $2\pi\alpha$ going in a given direction in the array (for example, clockwise) and opposite phase variation ($-2\pi\alpha$) in the opposite direction, where a is non-integer (e.g. $0.1<\alpha<0.8$, and generally $\alpha\neq 0.5$). This variation in coupling phase shift affects band structure of the array creating one or more topological modes, characterized as band-gap crossing modes. These topological modes typically have non-zero group velocity and propagate along edges of the array, thereby providing corresponding one or more topological paths for light propagation along edges of the array.

Further, according to the present invention, the optical elements of the array include selected gain material enabling emission of light of one or more selected wavelength ranges in response to pumping energy. Light intensity occupying the one or more topological modes of the array cause stimulated emission into the topological modes. Such optical intensity may be out-coupled at one or more selected locations along path of the topological modes to provide stable and coherent laser emission. The stability of the topological modes results in limited to no interaction with other modes of the array maintaining single-mode emission for a wide range of pumping power. In some configurations where two or more topological modes are supported by the array, the laser emission may contain two or more lasing modes corresponding to the topological modes of the array. Generally, such two or more lasing modes may have substantially similar spatial mode structure allowing the modes to be combined to a single beam.

In this connection, the optical elements may be configured as waveguide resonators. At least some of the resonators, including resonators located in spatial region of the topological modes, are doped with rare earth ions, or embedded with quantum dot arrangement, enabling stimulated emission/absorption of light of selected wavelength range. For example, the optical elements of the array may be resonators formed as resonating waveguide including core formed of semiconductor diode gain material. Such diode gain material may include layers of quantum $In_{x=0.74}Ga_{1-x}As_{y=0.57}P_{1-y}$ wells (e.g. having thickness of 10 nm each) sandwiched between cladding layers of $In_{x=0.56}Ga_{1-x}As_{y=0.93}P_{1-y}$ (e.g. having thickness of 20 nm), all grown on a p-type substrate such as Indium Phosphide (InP) and covered by a protective layer. According to some other configuration, the gain material may comprise one or more Nitride compounds configured to provide optical emission in response to pumping energy. In some configurations, the Nitride compound may comprise one or more layers of comprising Gallium related compound.

Generally, the gain material of the optical elements generates matter-light interaction in which photons are absorbed and/or emitted by the gain material. To provide optical emission, a group of one or more optical elements are pumped by optical and/or electrical pumping provided by the pumping unit. The group of optical elements that are pumped is selected to include at least some of the optical elements along the spatial region associated with the topological modes. Accordingly, at least some of the optical elements of the array, that do not take part in light propagation along the one or more topological modes, act as loss to the system, as less pumping energy is applied thereto (or no pumping at all).

It should be noted that generally, gain/loss light-matter interaction causes the system to be non-Hermitian in nature. As indicating above, it is assumed that such non-Hermitian system does not support topological modes. However, the inventors of the present invention have identified that introduction of gain material within optical elements associated with one or more topological modes of the array, combined with proper pumping condition, provides efficient and stable optical emission associated with the topological modes with limited to no mixing with other optical modes. This enable the use of a plurality of optical elements participating in lasing to provide high power, while maintaining single-mode and stable optical emission of the laser system.

Further, the topological insulator laser system as described herein displays stable and robust lasing in a single spatial and temporal mode, that remains the same mode for a wide range of pumping power, and is robust to defects, disorder and fabrication imperfections in the system, enabling stable, single-mode lasing where a plurality of gain elements shares a combined, coherent, lasing mode. Moreover, due to the topological nature of the lasing mode, the laser system can maintain operation while supporting high out-coupling of power. Simply put, the topological design of the laser array system makes very many laser emitters operate together as a single highly coherent high power laser source.

Generally, to support topological modes without backscattering between modes, time reciprocity within the system is typically broken. More specifically, a system is reciprocal if it is symmetric with respect to time, i.e. lunching the output of the system in the opposite direction results in recovery of the corresponding input. Reciprocity of the system may be broken utilizing various configurations and techniques. Conventionally, introduction of external magnetic field onto the system is used for breaking of reciprocity as light path along field lines or against field lines accumulated different phase shifts. However, as mentioned above, the inventors of the present invention have identified that providing suitable array structure enabling symmetry of optical coupling within the array (e.g. provide phase shift difference between coupling directions) in addition to the nonlinearity provided by gain saturation associated with lasing action of the optical elements, maintains a system state in which reciprocity is broken and supports topological modes of the system. This causes the array to provide lasing power primarily in one direction, without scattering backwards even in the presence of defects, disorder, and fabrication imperfections.

As indicated above, the use of topological lasing mode of the system provides an active lasing mode that is shared by a plurality of optical elements (e.g. resonators carrying gain material) while maintaining a stable and coherent mode. Moreover, the topological nature of the mode provides lasing that is robust to local imperfections such as defects in the array, or certain level of disorder, e.g. variation on the characteristic of the optical resonators of the array due to fabrication or operational conditions. Further, the topological lasing mode has well defined path within the array, enabling to maintain strong coupling to an output port by providing the output port along path of the topological mode. This allows extraction of high radiation intensity as compared to conventional laser systems, wherein over extraction causes loss in the extracted mode and may stop emission of the laser. According to the present technique, optical emission within the topological mode is effectively insulated from other modes of the array, thereby enabling high out-coupling loss without directing optical emission to other non-topological modes. Combined with the use of a plurality of gain elements, this enables high power laser system providing high efficiency and stable mode of coherent emission robust to disorder and imperfections.

Further, the laser system described herein may include a plurality of gain carrying optical elements that are not located in spatial region of the topological mode, and accordingly, such optical elements can be passive (no gain nor loss), partially pumped, or generating high loss. This reduces participation of array regions that are not associated with the topological modes in optical emission, thus assisting to make sure that only the topological modes lase. The inventors of the present invention have understood, that such optical elements are typically required for maintenance of the topological lasing mode and provide regions of evanescence coupling decay of light intensity from the topological lasing mode to the bulk of the array (e.g. exponential decay in light intensity coupled from the edges and into bulk of the array), thereby maintaining stability of the laser system. Accordingly, as described in more details further below, the bulk regions may be used by the topological mode to maintain the path of the topological mode in case of edge defects that limit light propagation within the topological modes. This provide additional path options that may be generated by the topological mode when the edge related path is obstructed.

To this end, the topological insulator laser system, according to some embodiments of the invention may be formed by a two-dimensional array of optical elements, e.g. ring or helical resonators, arranged such that light components coupled in one direction between different rows (or columns) of the array accumulates certain phase shift opposite to light components coupled the opposite (backwards) direction. The resonators of the array are impregnated with selected gain material, by addition of quantum wells or dots, rare earth ions or any other gain material within the resonators, thus enabling each of the resonators to support at least one lasing mode. Further, the topological insulator laser system comprises a pumping unit configured to provide pumping power to at least a group of the optical elements located along at least a portion of the array to provide lasing of one or multiple topological modes of the system. The pumping energy is preferably selected to provide saturated pumping of the gain material and enable at least local (within the relevant optical elements) lasing activity. Typically, the topological insulator laser system also comprises an output port, optically coupled to one or more of the optical elements along edge regions of the array. The output port is configured to provide out-coupling of a portion of light inside the laser array to thereby provide output radiation from the laser system.

Generally, the gain material and local configuration of each of the optical elements are selected to provide certain overlap between at least a portion of the emission spectrum of the gain material and supported spectrum of the optical elements. For example, in the case of resonators (such as ring, helical of any other resonators), the gain material is selected to emit radiation in wavelength range corresponding with resonance range of the resonators. Such resonance range of the resonators is selected in accordance with material composition (e.g. refractive index) and physical dimensions thereof. The pumping power is preferably selected to be above the pumping level that provides gain equal to the threshold gain level (determined by the losses in the array). Under such conditions, the array lases, which means that at every lasing mode the gain is clamped to the threshold gain (by the nonlinear action of gain saturation) and the pumping power above threshold is transformed into the optical power of the lasing mode. In the topological array system, the topological lasing mode moves around the array (with a certain group velocity determined by the dispersion curve), and in doing that it forces the gain elements to laser at the same frequency. It is important that the pumping region is preferably selected to overlap with a region associated with the topological mode. It should however be noted that stability of the topological lasing mode enables active lasing of the system when only a portion of the region associated with the topological mode undergo pumping.

The topological mode of the topological insulating laser as described herein, is typically an edge mode propagating in clockwise and/or counterclockwise directions along peripheral edges of the array. Generally, such topological mode has certain width corresponding to radiation intensity within optical elements in one or more lines (rows and columns) of the array that are internal with respect to the edge. Accordingly, the region associated with the topological mode may have certain width (herein referred to as width of the topological mode), corresponding to evanescence decay of light intensity of the topological modes into the bulk of the array. Such width may be within the range of 1-4 unit cells of the array. In some configuration, the selected region for pumping corresponds with width of the topological mode.

Thus, according to one broad aspect, the present invention provides a laser system comprising:

- an array of optical elements comprising optical elements comprising gain material, the optical elements of the array are optically coupled between them and are spatially arranged supporting at least one topological mode associated with certain spatial region of the array;
- a pumping unit configured to provide pumping of a group of the optical elements of the array within at least a portion of the spatial region corresponding with said topological mode; and
- at least one output port optically coupled to one or more of the optical elements associated with said topological mode, said at least one output ports being configured for extracting a portion of light intensity from said laser system.

According to some embodiments the array of optical elements may be configured as a photonic crystal having a band structure associated with photonic states within said photonic crystal, said band structure comprising one or more photonic states crossing a gap between bands of the photonic states; said one or more photonic states crossing said gap correspond with the at least one topological mode within the array.

The array may be a two-dimensional array, said at least one topological mode being associated with at least one edge states travelling along periphery of said array.

According to some embodiments the optical elements may be arranged with spatial variation between them providing phase shift to light components coupled between rows of the array in one direction different with respect to opposite direction.

According to some embodiments the coupling between said optical elements of the array may be configured such that coupling between optical elements of different rows introduce selected phase shift to light coupling in one direction and different phase shift to light coupling in the opposite direction.

According to some embodiments the optical elements are optical resonators. For example, the optical elements may be ring resonators, S-shape resonators, and may comprise one or more helical portion.

According to some embodiments the array may comprise at least two optical links coupling between said optical resonators of the array, said optical links are accommodated with selected spatial shifts with respect to an axis between corresponding resonators thereby providing phase difference associated with two optical paths connecting said resonators through the links.

The optical links may be arranged with shifts with respect to an axis between corresponding resonators, said shifts vary between different rows of the array. The shifts in location of the optical links may vary by predetermined step level between different rows of the array.

According to some embodiments the array may be configured as a two-dimensional array, said array comprises a plurality of optical links coupling between adjacent optical resonators, optical links of different rows of the array are shifted with respect to optical links of neighboring rows by a predetermined shift, thereby providing predetermined shift in phase accumulation of light passing through said links in clockwise or counterclockwise directions.

According to some embodiments the optical resonators may be directly coupled between them, and wherein at least one of internal resonator geometry and coupling between neighboring resonators is varied along the array providing said optical topological mode.

According to some embodiments the optical resonators may be arranged in a hexagonal array forming first hexagonal arrangements characterized first coupling constant within the hexagonal arrangement and a second coupling constant, lower with respect to the first coupling constant between neighboring hexagonal arrangements.

According to some embodiments the optical resonators may be characterized by first resonant frequency, said array comprises a plurality of link couplers located between neighboring resonators of the array to provide coupling between them, said link couplers having a second resonant frequency different than said first resonant frequency. The link couplers are positioned to be strongly coupled to neighboring resonators at said first resonant frequency.

According to some embodiments the array may have lattice geometry selected from: rectangular, hexagonal, honeycomb or having a triangular lattice of sub-array units where each unit is formed by honeycomb lattice.

The at least one topological mode may have non-zero state velocity.

According to some embodiments the gain material may comprise at least one Nitride compound. The Nitride compound may comprise at least one Gallium containing layer.

According to some embodiments the at least one output port may comprise at least one optical fiber arranged along a selected and wherein a region of said optical fiber is positioned in close proximity to at least one optical element located at edge of the array to thereby enable out coupling of optical emission from one or more topological modes of the array.

The laser system may generally be configured to operate under zero magnetic field conditions. More specifically, the topological modes are supported by the arrangement of the array, while not requiring external magnetic field being constant or partially varying.

According to yet another broad aspect, the present invention provides a topological laser system comprising an array of optical resonators arranged in predetermined arrangement, said optical resonators being configured with gain material selected for emission of optical radiation in certain wavelength range, a plurality of optical link couplers located between adjacent optical resonators providing coupling of optical intensity between the optical resonators, output coupling unit located in proximity to one or more of optical resonators along edge of the array and configured for coupling selected portion of light out of the laser system, and a pumping unit configured for pumping a selected region along edges of the array; wherein said plurality of optical link couplers being arranged with selected shifts with respect to axis defining rows of the array, said selected shifts varying between rows of the array.

According to yet another broad aspect, the present invention provides a topological laser system comprising:
an array of optical resonators arranged in hexagonal lattice and defining a plurality of hexagonal arrangements characterized by first coupling rate within said hexagonal arrangements and second coupling rate lower than the first coupling rate between neighboring hexagonal arrangement, said optical resonators comprising optical resonators carrying gain material configured for emitting optical emission at wavelength range associated with resonant frequency of said resonators;
a pumping unit configured for providing pumping energy to at least a portion along edges of said array; and
at least one output port comprising optical waveguide coupled to one or more resonators along edges of said array.

According to yet another broad aspect, the present invention provides a topological laser system comprising:
an array of optical resonators characterized by first resonant frequency, and a plurality of link couplers having second resonant frequency different than the first resonant frequency, said link resonators arranged between neighboring resonators along lattice vectors defined by the array, said link couplers being strongly coupled to the neighboring resonators at said first resonant frequency, said optical resonators comprising optical resonators carrying gain material configured for emitting light at wavelength corresponding with said first resonant frequency;
a pumping unit configured for providing pumping energy to at least a portion along edges of said array; and
at least one output port comprising optical waveguide coupled to one or more resonators along edges of said array.

According to yet another broad aspect, the present invention provides a laser system comprising:
an array of optical elements comprise optical elements carrying gain material, the optical elements of the array are optically coupled between them and are spatially accommodated such that the array supports at least one topological mode associated with certain spatial region of the array;
a pumping unit configured to provide pumping of a group of the optical elements of the array within at least a portion of the spatial region corresponding with said topological mode; and
at least one output port optically coupled to one or more of the optical elements associated with said topological mode, said at least one output ports being configured for extracting a portion of light intensity from said laser system.

The optical elements may be configured as semiconductor laser cavities such as resonators, ring resonators, helical resonators, and S-ring resonators.

According to some embodiments, the array of optical elements may be configured to provide a photonic crystal having a band structure associated with photonic states within said photonic crystal, said band structure comprising one or more photonic states crossing a gap between bands of the photonic states; said one or more photonic states crossing said gap correspond with the at least one topological mode within the array.

According to some embodiments, the array is a two-dimensional array, said at least one topological mode being associated with at least one edge states travelling along periphery of said array.

According to some embodiments, coupling between said optical elements of the array is configured such that coupling between optical elements of different rows introduce selected phase shift to light coupling in one direction and different phase shift to light coupling in the opposite direction.

According to some embodiments, the optical elements are optical resonators.

According to some embodiments, the optical resonators are ring resonators.

According to some embodiments, the optical resonators comprise at least one helical portion.

According to some embodiments, the array comprises at least two optical links coupling between said optical resonators of the array, said optical links are accommodated with selected shifts with respect to an axis between corresponding resonators thereby providing phase difference associated with two optical paths connecting said resonators through the links.

According to some embodiments, the array is configured as a two-dimensional array and comprises a plurality of optical links coupling between adjacent optical resonators, optical links of different rows of the array are shifted with respect to optical links of neighboring rows by a predetermined shift, thereby providing predetermined shift in phase accumulation of light passing through said links in clockwise or counterclockwise directions.

According to some embodiments, the optical resonators are directly coupled between them, and wherein at least one of internal resonator geometry and coupling between neighboring resonators is varied along the array providing said optical topological mode.

According to some embodiments, the array has lattice geometry selected from: rectangular, hexagonal, honeycomb or having a triangular lattice of sub-array units where each unit is formed by honeycomb lattice.

According to some embodiments, at least one topological mode has non-zero state velocity.

According to some embodiments, the gain material comprises at least one Nitride compound.

According to some embodiments, the Nitride compound comprises at least one Gallium containing layer.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 5B shows band structure of symmetric non-topological array configuration.

FIG. 6A shows microscope image of the array configuration, FIG. 6B shows electron microscope of an output grating, FIG. 6C shows electron microscope of an enlarged portion of a region of the array, and FIG. 6D illustrates tilted view and exemplifies operation and emission of the laser system according to some examples;

FIGS. 7A to 7D show measurements of laser operation for topological array and symmetric non-topological array, FIG. 7A shows emission vs. pump intensity graph, FIG. 7B shows emission spectrum, and FIGS. 7C and 7D show evolution of emission spectrum for varying pumping level;

FIGS. 8A to 8H show comparison of topological protection with respect to non-topological laser array, FIGS. 8A and 8E show variation of emission spectrum along edges of the array, FIGS. 8B and 8F show emission corresponding with full perimeter pumping, FIGS. 8C and 8G show emission corresponding with half perimeter pumping, and FIGS. 8D and 8H show emission and lack thereof, corresponding with pumping of one side of the array;

FIGS. 9A and 9B show an experimental comparison between topological laser array according to some embodiments of the invention and non-topological array with respect to existence of edge defects in the array;

FIGS. 10A to 10D show array configuration utilizing S-ring resonators configured for differentiating between clockwise and counterclockwise modes, FIG. 10A shows an electron microscope image of the array, FIG. 10B shows and enlarged region of the array exemplifying configuration of the S-ring resonators, FIG. 10C illustrates light propagation within an S-ring resonator, and FIG. 10D exemplifies directional emission from the array according to some embodiments of the invention

DETAILED DESCRIPTION OF EMBODIMENTS

As indicated above, the phenomena of topological insulators emerged in condensed matter physics, and constitutes a new phase of matter, with insulating bulk and quantized and robust edge conductance. Such topological effects have been observed in non-electronic systems and in particular in optical lattices (photonic crystals). The conventional configurations of topological insulators in optical systems relate to Hermitian representation of the system (e.g. no gain/loss of photons) and/or required introduction of external magnetic fields or of artificial gauge fields promoting topological edge states. The present invention provides a novel configuration of topological insulator laser system, where spatial arrangement and pumping characteristics preserve one or more lasing modes using topological characteristics of the selected modes. The laser system enables stable and coherent emission from an array of optical elements carrying gain, as well as robustness with respect to local variation such as defects or disorder in the array.

Figure 1:
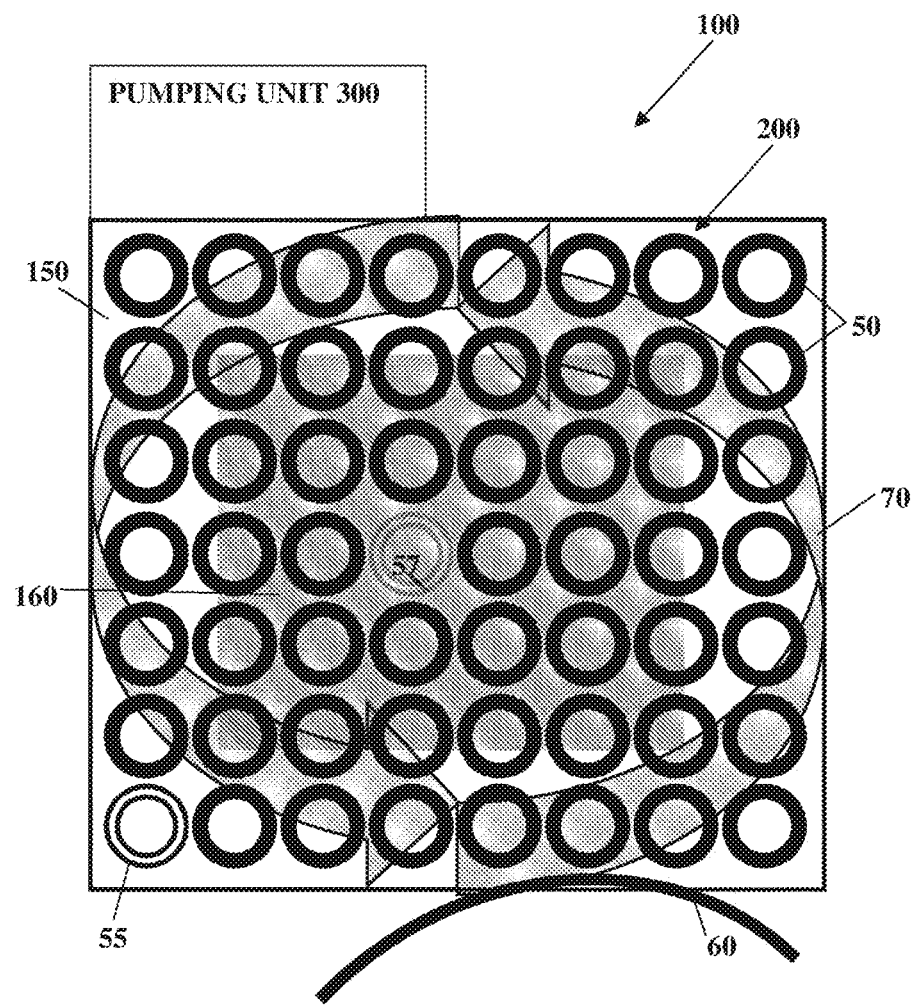
FIG. 1 illustrates schematically a topological insulator laser system according to some embodiments of the present invention.

Reference is made to FIG. 1 exemplifying a topological insulator laser system 100 according to some embodiments of the invention. The laser system 100 includes an array 200 of optical elements 50 arranged in predetermined spatial configuration forming the array 200. The optical elements 50 include a plurality of optical elements carrying gain material as described in more details below. The arrangement of the optical elements 50 and coupling between them, are selected such that the array has one or more topological modes 70 associated with certain spatial region 150. Typically, the topological modes are edge modes, i.e. the topological modes are associated with spatial regions along edges of the array and have limited penetration depth into bulk of the array 160 as described in more details below. The laser system 100 also includes a pumping unit 300 configured to provide pumping to at least a group of the optical elements 50 along at least a portion of the spatial region 150; and at least one output port/coupler 60, coupled to one or more of the optical elements and configured to extract at least a portion of electromagnetic radiation therefrom to provide output emission of the laser system 100. Generally, the optical elements 50 may be laser cavities such as optical resonators. The optical elements 50 may be ring resonators, helical resonators, S-ring resonators etc. For simplicity, the optical elements are referred to herein at times as resonators.

Generally, optical elements 50 located at spatial regions along edges of the array 150 and associated with the topological modes of the array are configured with gain material to participate in optical emission of the laser system. In some configurations, additional optical elements of the array, e.g. elements located within bulk 160 of the array are also configured with gain material. In some other configurations, the optical elements of the array may all be configured with gain material.

The laser system 100 is configured as a topological insulator laser system. More specifically, lasing mode of the laser system 100 exhibits topologically-protected transport, such as a mode in which the light propagates along the edges of the array in a unidirectional fashion, immune to scattering and disorder, unaffected by the shape of the edges. The topological properties of the array 200 may provide a highly efficient laser, robust to fabrication and operational disorder and defects (e.g. exemplified by optical elements 55 and 57), and single-mode lasing even at gain values high above the laser threshold. This are a result of global nature of the topological mode, which reduces light interaction with other modes and thus force light to propagate along the topological mode. For example, the topological mode is generally not affected by local effects caused by disorder in the array structure, illustrated by shifted optical element 57. Further defects on optical elements 55 along propagation path of the topological mode 70, cause shift in the topological mode such that the mode continues to propagate with slight intrusion into bulk of the array and effectively skips the defected location 55.

There are various spatial configurations of coupled optical elements (e.g. resonators) that give rise to topological insulator modes. Generally certain breaking of reciprocity or time symmetry for propagation of optical radiation within the array may give rise to such topological modes. Several array models are known, associated with planar arrays of coupled resonators that may give rise to topological modes. As indicated above, the inventors have found that introduction of gain material may vary the conditions for reciprocity, and accordingly for topological modes. However, the presence of saturated gain material (under suitable pumping conditions) introduces nonlinearity to the array and may support such topological modes. It should be noted that the condition of reciprocity breaking may be different between array configurations. The use of external field (e.g. magnetic field) enables providing this condition in various array configurations. According to some embodiments of the present invention, certain array configurations may enable support of topological lasing modes utilizing spatial array configuration, contradicting the requirement for external field and giving rise to laser system that is usable in various applications.

Generally, in some configurations, the optical elements 50 of the array 200 are arranged to provide certain phase shift a-symmetry in coupling between adjacent optical elements 50 (e.g. resonators). Such phase shift a-symmetry may be associated with variation of phase accumulated by light components coupled between optical elements in one direction with respect to coupling light components between the same optical elements in the other direction. In some configurations, such coupling may be direct between the optical elements, e.g. providing an array of strongly coupled resonators. In some other configurations, a plurality of link couplers may be arranged between each pair of optical elements. The links may be arranged to introduce the desired phase variations by proper aligning with respect to axis of the array.

Figure 2:
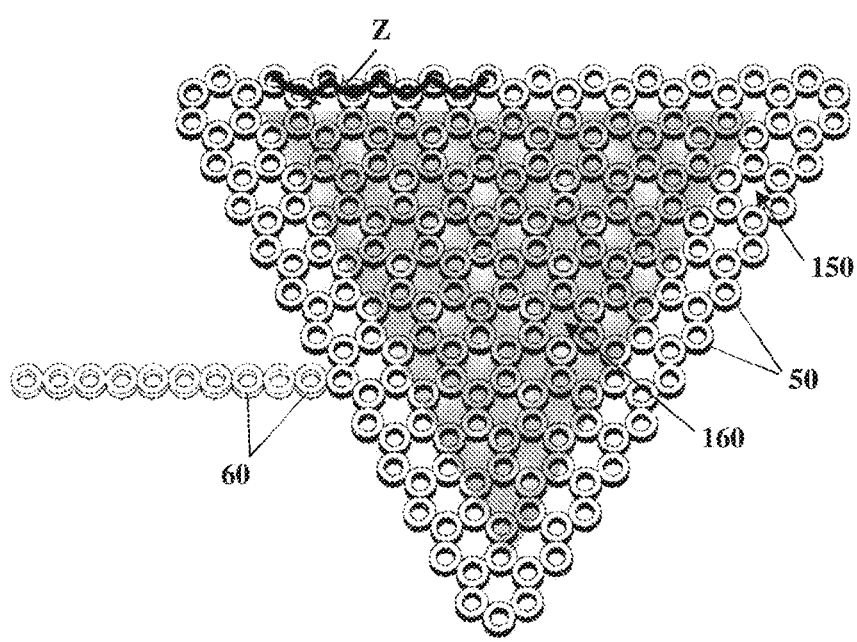
FIG. 2 illustrates an array of optical resonators capable of supporting topological modes in presence of external field and suitable for the laser system according to some embodiments of the invention.

Reference is made to FIG. 2 exemplifying honeycomb lattice configured to support topological edge mode in the presence of a non-uniform external field with zero net flux per hexagonal unit cell. The lattice includes a plurality of resonators 50 arranged in a honeycomb lattice. Each resonator is coupled to its nearest neighbors by a real hopping parameter $t_1$, and to its second neighbors by a complex parameter $t_2 \exp(i\phi)$. The two sublattices of the honeycomb structure have identical on-site potentials (e.g. determined by refractive index and dimensions of the resonators). Generally, when the lattice is passive, i.e. does not include any gain material or loss, the array configuration exhibits two phases: the trivial phase when $\phi$ (the Haldane flux parameter) is equal to 0 or $\pi$, and the topological phase when $\phi \neq 0, \pi$. In the topological phase, the energy range of the edge states extends across the topological gap, generally proportional to $t_2 \sin(\phi)$ in this array configuration. Generally variation of the topological phase $\phi$ is provided by external field, such as non-uniform magnetic field applied to the array.

According to some embodiments of the present invention, the honeycomb array is designed to have zig-zag edges having small penetration depth into the bulk of the array, this is illustrated in FIG. 2 by Z line. This edge profile enables promoting the topological edge modes as optical paths along the edge of the array show direct nearest neighbors and next nearest neighbors interactions, simplifying the analysis of the array. It should however be noted that the topological nature of the edge modes is generally maintained with different edges of the array, including edge defected as exemplified further below. The evolution of the field of this laser system can be described by $$i\frac{\partial \vec{\psi}}{\partial t} = H_{Haldane}\vec{\psi} - i\gamma\vec{\psi} + \frac{ig\mathbb{P}}{1+|\vec{\psi}|^2/I_{sat}}\vec{\psi} + H_{output}\vec{\psi},$$ (equation 1)

where $\vec{\psi}$ is a column vector encompassing the modal amplitudes of the array elements, $H_{Haldane}$ is the standard Haldane Hamiltonian, which depends on the resonance frequency of a single resonator $\omega_0$, the hopping constants, $t_{1,2}$, and the Haldane flux parameter $\phi$, and can be driven based on equations of motion describing coupling between resonators of the array. Additionally, $\gamma$ represents the loss in each resonator, and is assumed to be linear loss (as in all continuous wave lasers). It should however be noted that the inventors have found that saturable loss may also provide topological effects, while enable active lasing operation of the array. The third term in equation 1 represents optical gain g via stimulated emission that is inherently saturable $I_{sat}$; where $\mathbb{P}$ stands for the spatial profile of the pump along edge regions associated with the topological modes 150, as opposed to bulk region 160 that is not pumped and thus induces loss. In the fourth term of the right-hand side of equation 1, $H_{output}$ describes the output coupler 60 (e.g. represented by a semi-infinite chain of resonators), providing the system to act as an open system that can output laser power.

To promote lasing of the edge modes, the pumping is provided only to the resonators on the perimeter 150, these resonators are generally associated with the spatial region of the topological mode and preferably include a plurality of optical elements carrying gain material. More preferably, all the optical elements along the edge regions carry gain material. In various configurations, the gain material may be in all of the resonators of the array, however such material provides operative gain only under sufficient (saturable) pumping, while without pumping it acts as loss.

Figure 3:
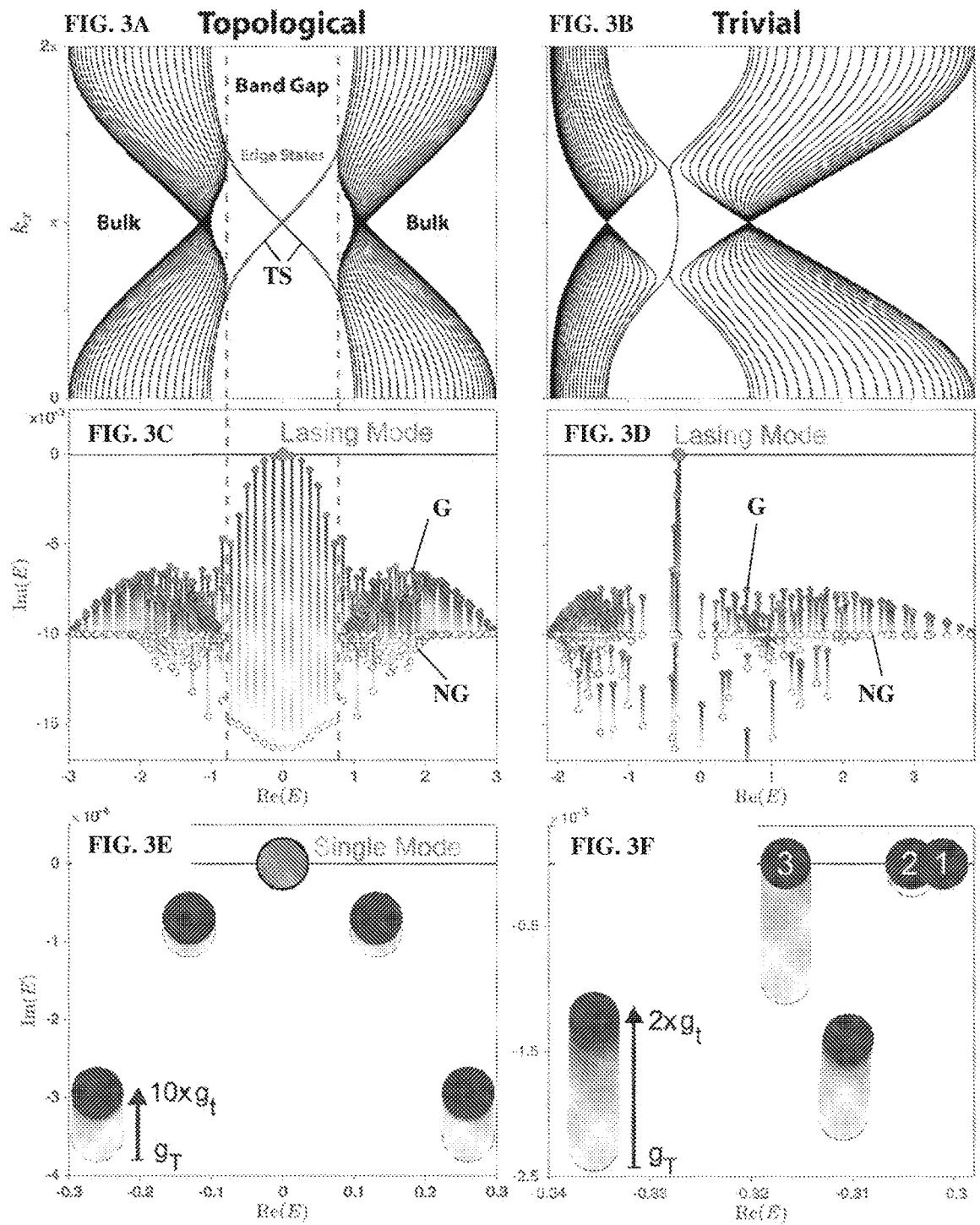
FIGS. 3A to 3F show calculated band structure for topological array and trivial array exemplified in FIG. 2 (FIGS. 3A and 3B respectively), mode evolution in presence of pumping energy for topological and trivial array (FIGS. 3C and 3D respectively), and lasing mode evolution for topological and trivial array (FIGS. 3E and 3F respectively)

FIGS. 3A to 3F show analysis of the lasing process in laser array system as exemplified in FIG. 2 for the topological configuration (e.g. $\phi=\pi/2$) and the "normal" configuration where $\phi=0$. FIGS. 3A and 3B show calculated band diagrams for the topological and normal configurations respectively without the use of gain material; FIGS. 3C and 3D show calculated evolution of real and imaginary spectrum parts in the topological and normal configurations in the case of zero pumping of the gain material NG and threshold pumping for laser activity G, as well as the lasing mode; and FIGS. 3E and 3F compare evolution of the laser spectrum with increased pumping above the lasing threshold for the topological and normal configurations respectively. The lasing mode evolutions shows single lasing mode in the topological configuration of FIG. 3E and three lasing modes (marked as 1, 2 and 3) in the non-topological configuration of FIG. 3F.

As shown in FIG. 3A, the topological array configuration has a bandgap with topologically-protected unidirectional edge states TS that cross the gap between bands. The band structure of the non-topological (trivial or normal as also referred to herein) array of FIG. 3B does not show and band gap and accordingly no protected states, where the edge states are degenerate. The spectrum evolution showing real and imaginary part of the spectrum of FIGS. 3C and 3D illustrates spectrum variation between zero pumping NG and lasing threshold pumping G, as well as the spectrum evolution of FIGS. 3E and 3F show generation of single lasing mode in the topological configuration while expected multi-mode operation of the non-topological array. As illustrated in FIG. 3E, the topological insulator laser, utilizing array configuration of FIG. 2 may maintain single mode lasing for pumping energy between at least up to ten times the threshold gain pumping. This is while non-topological arrays become multimode, with three (or more) lasing modes, at a gain level just twice the threshold gain.

Figure 4:
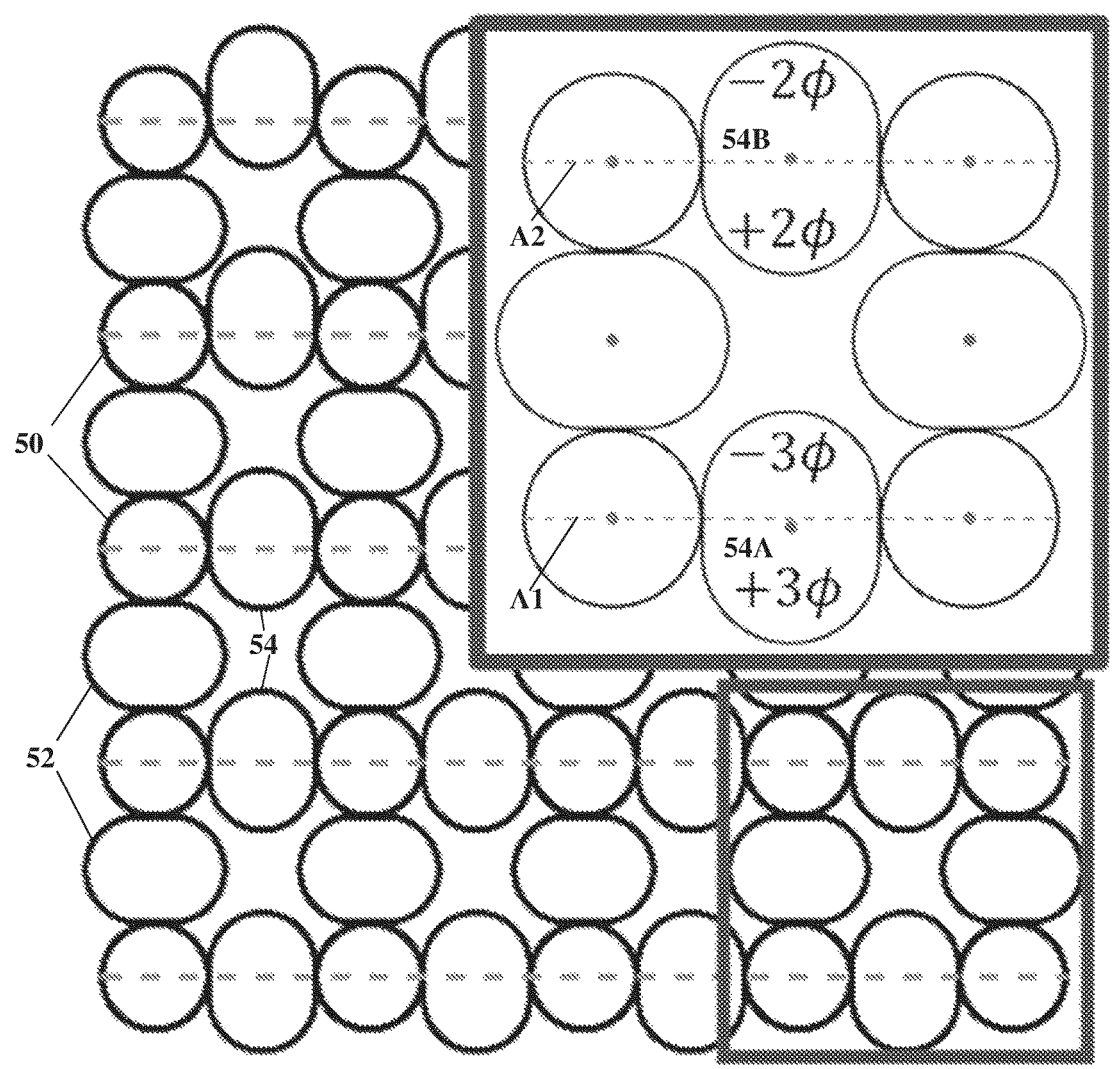
FIG. 4 illustrates schematically an array of optical resonators capable of supporting topological modes utilizing only array configuration and suitable for use in laser system according to some embodiments of the invention.

An alternative, and at times advantageous array configuration is exemplified in FIG. 4. In this example, the array is based on aperiodic resonators arrangement that, in accordance with aperiodicity parameter, provides one or more topological modes. The array in this example includes a plurality of resonators 50 arranged in a rectangular array, although various other array symmetries may also be used. The resonators are coupled between them through corresponding plurality of coupling links 52 and 54. As shown in the enlarged region of FIG. 4, the links 54A and 54B, arranged in different rows of the array are shifted with respect to general axis of the array resonators, axes A1 and A2 for different rows, to provide variation of phase shift accumulated by light coupled between the resonators in one direction (clockwise CW) with respect to light coupled in the other direction (counterclockwise CCW).

Generally, the coupling links 52 and 54 are similar and vary by coupling axis, i.e. in this example links 54 provide horizontal coupling and links 52 provide vertical coupling. It should be noted that additional axes may be used for other lattice configurations (such as hexagonal lattice) where coupling links of at least one selected axis are configured with varying shift along perpendicular direction to the corresponding axis. It should also be noted that generally, to provide the desired topological behavior of the array, the coupling links 54 are shifted between rows, while coupling links 52 may be arranged periodically in accordance with the array structure. It should also be noted that the terms horizontal and vertical, as well as rows and columns, are used herein for simplicity and rotation of the array may switch between the axes in accordance with point of view of an observer.

The array configuration of FIG. 4 exemplifies an aperiodic topological array of micro-ring resonators. As indicated, this arrangement is based on a lattice of coupled resonators 50 with coupling links 52 and 54, where links 54 are configured in aperiodic arrangement with respect to the array structure and are referred to herein at times as aperiodic couplers. Such array configuration may give rise to topological modes while not requiring the use of external field and thus provides a useable laser system, utilizing conventional material and current semiconductor laser (gain material configuration) technology.

Configuration of the coupling links 52 and 54 provides an effective (artificial) gauge field differentiating between clockwise and counterclockwise photonic states. Such array configurations have been presented in passive/linear optical resonators that do not include gain. However, it should be noted and is described above, that introduction of nonlinearity, represented by saturated gain material, to the system is considered to vary conditions for reciprocity. More specifically, in the linear configuration of the resonators, both the clockwise (CW) and counterclockwise (CCW) modes in each resonator 50 experience gauge fields with opposite signs. This, results in degenerate states of the array, i.e. for any frequency supported by the CW modes there is a corresponding CCW mode. When gain material is introduced into the resonators 50, according to the present technique, gain/loss characteristic is added providing inevitable interaction between the CW and CCW modes through the nonlinear effect of gain saturation resulting in mode competition between the CW and CCW modes and effectively breaking reciprocity once one mode dominates over the other.

Generally, the topological insulator laser system according to some embodiments of the invention may thus be configured by an array of coupled semiconductor laser cavities (e.g. resonators 50) arranged in a lattice of selected geometry (e.g. rectangular, hexagonal, honeycomb, etc.). The laser cavities are coupled between the by a plurality of coupling links 52 and 54, where coupling links 54 are configured to be shifted with respect to lattice arrangement along at least one axis of the array structure. The links may typically configured to be off-resonant with the resonators 50 providing that light mostly inhibits the cavities.

Aperiodic/shifted arrangement of the links provides an axis-dependent (e.g. vertically dependent) phase shift that accumulates with light coupling along one axis, e.g. along the horizontal axis. As indicated above, such phase shift may be provided by predetermined shift of location of optical links associated with different rows (or columns) of the array with respect to optical links of neighboring rows (or columns). This shift in position of the coupling links 54A and 54B provides variation in optical path for light coup-ling in clockwise or counterclockwise directions, and thus the light accumulated different phase shifts.

To promote the lasing of the topological edge modes, the pumping unit (300 in FIG. 1) is configured to provide pumping energy to perimeter of the array, associated with spatial region occupied by the topological mode(s). This pumping provides excitation of the gain in the corresponding resonators 50 while the interior resonators 50 provide no gain or are lossy. The light exits the cavity via the output coupler (60 in FIG. 1) to provide output emission from the laser system. Generally, the coupling links 54 and 52 are transparent (no gain nor loss), however in some configurations the links 54 and 52 may also include gain material and thus participate in the lasing, or provide loss. It should be noted that as the links are off resonant from the resonators 50, the links 54 and 52 provide limited lasing activity even when introduced with gain material.

Figure 5A:
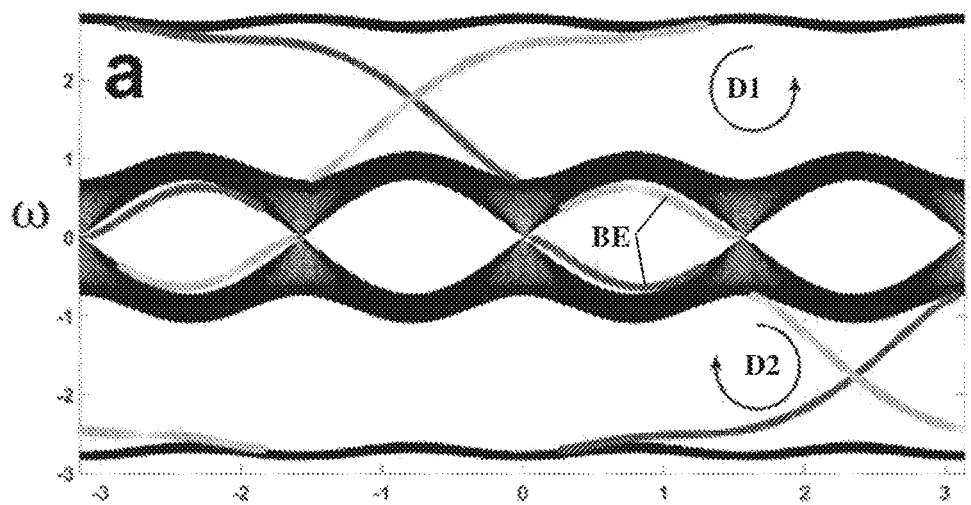
FIGS. 5A to 5C show calculated band structure for array configuration as exemplified in FIG. 4, FIGS. 5A and 5C show band structure for topological array configuration for clockwise and counterclockwise directions.
Figure 5B:
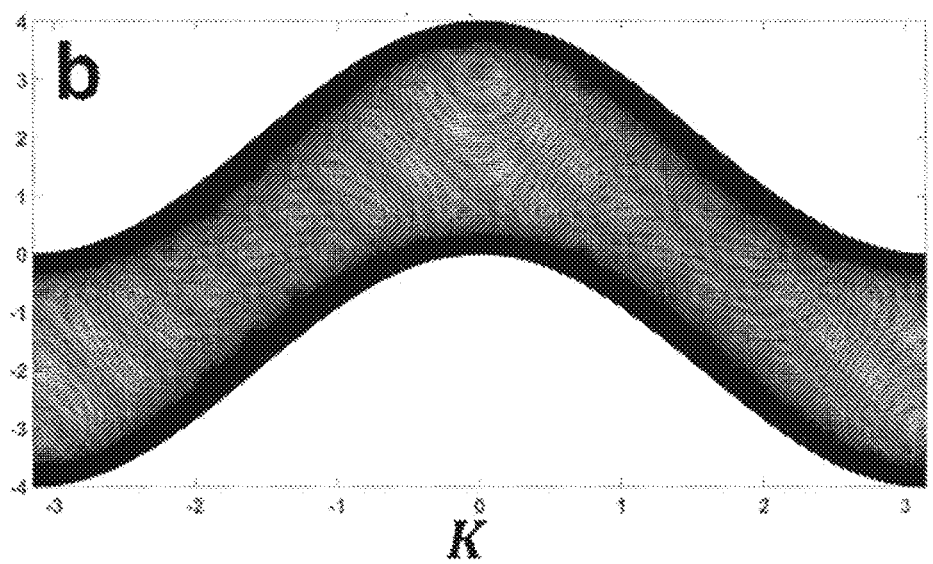
Figure 5C:
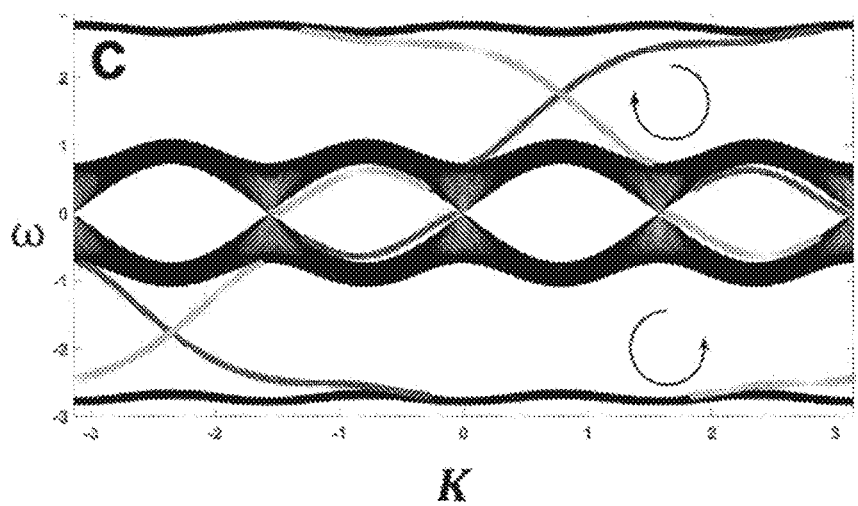

Reference is made to FIGS. 5A to 5C showing band diagram of the aperiodic array configuration illustrated in FIG. 4. FIG. 5A shows band diagram of the clockwise modes having $\pi/2$ phase flux; FIG. 5B shows band diagram of similar array configuration having no shift between links of different rows (periodic array); and FIG. 5C shows band diagram of the aperiodic array for the counterclockwise modes providing mirror image of FIG. 5A. Arrows D1 and D2 in FIG. 5A illustrate modes propagating in counterclockwise and clockwise directions with respect to the entire array, while having clockwise path within each resonator. Similar arrows in FIG. 5C show direction of mode propagation along the array while having counterclockwise direction within the resonators. As shown, the topological phase may be associated with a $\pi/2$ phase flux and may thus support two topological modes for both CW and CCW circulation inside the resonators. Accordingly, the topological modes shown in FIG. 5A are generally coupled with the modes of FIG. 5C and may have similar energy. Further, in the presence gain material causing interaction between the CW and CCW modes, topological modes moving in one direction may generally transfer energy to topological modes of the opposite direction providing circulation of edge modes in both directions. Thus, FIGS. 5A and 5C illustrate that topological modes are formed in the array configuration and these topological modes may include modes associated with both CW and CCW direction within each resonator as well as global clockwise and counterclockwise modes that differ in propagation around edges of the array. It should be noted that in some configurations S-type resonators may be used, such resonators are configured for supporting only one direction within the resonator, e.g. providing band structure as exemplified on FIG. 5A only. Additionally, edge states BE may arise, having frequencies corresponding to the bulk band. FIG. 5C illustrates similar band structure resulting from excitation of the array in a CCW mode only.

Figure 6A:
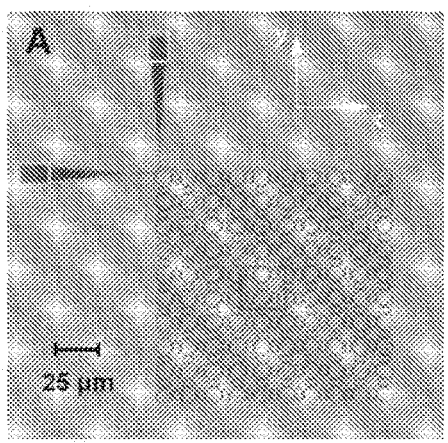
FIGS. 6A to 6D show microscope images and computer-generated illustration of a topological laser array according to some embodiments of the invention.
Figure 6B:
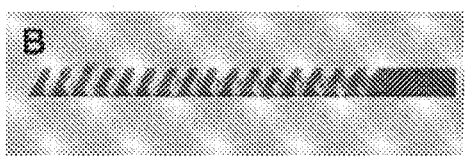
Figure 6C:
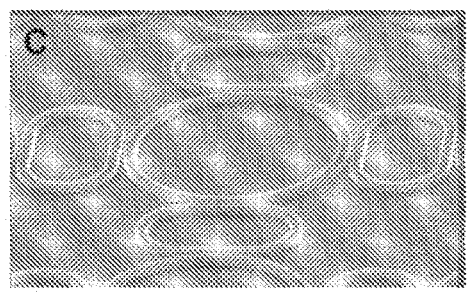
Figure 6D:
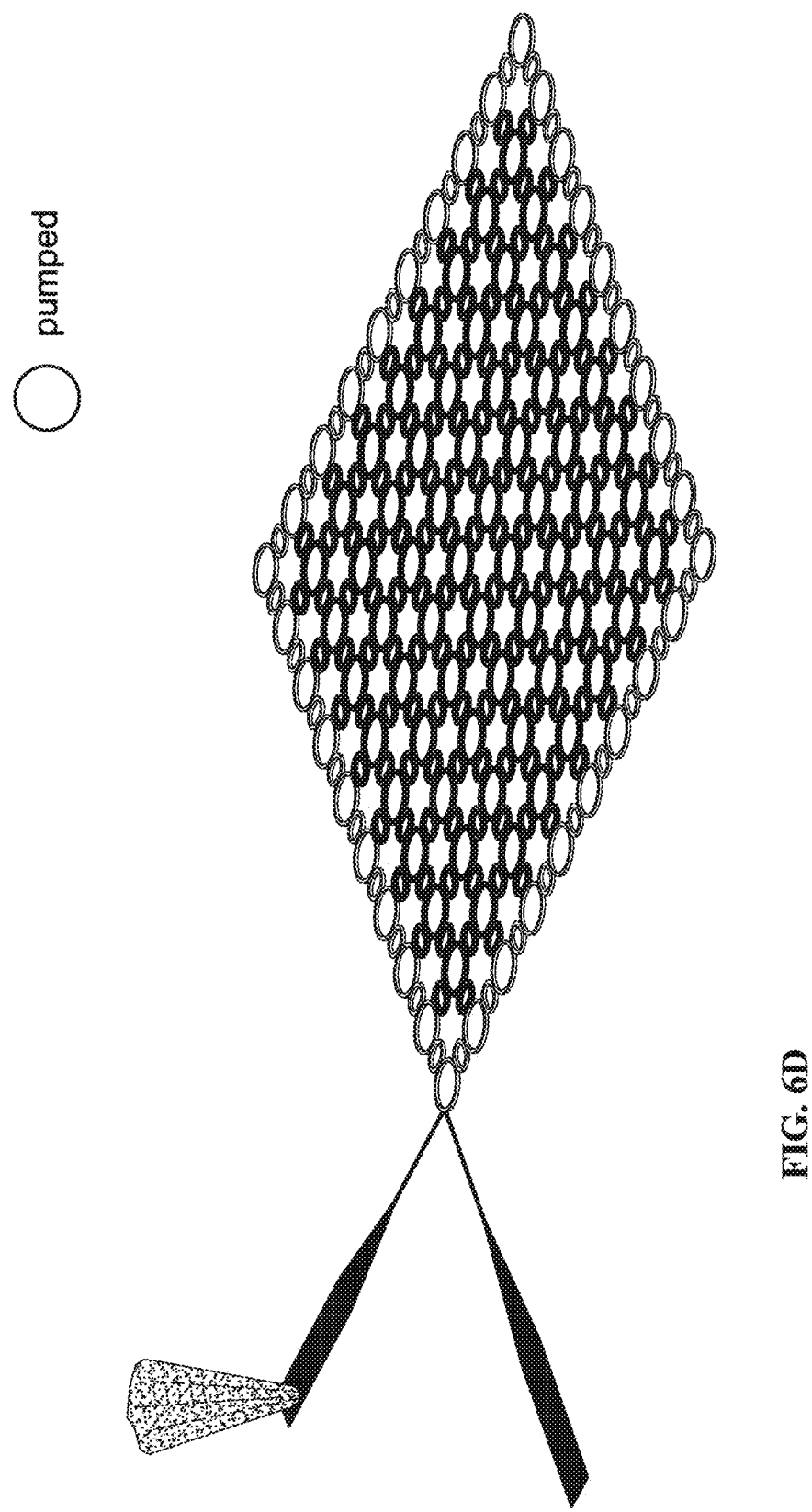

Reference is made to FIGS. 6A to 6D showing experimental configuration of a laser system according to some embodiments of the invention. An array including configuration of 10×10 coupled ring-resonators was fabricated on an active platform as shown in FIG. 6A. The platform includes vertically stacked 30 nm thick InGaAsP quantum wells acting as diode laser gain material. The resonators 50 of the array are coupled between them vie links as described above, and an output coupler 60 is provided coupling the array to a waveguide using out coupling grating. A top image if the array is shows in FIG. 6A, and an enlarged region around one resonator is shown in FIG. 6C. Out-coupling gratings arrangement providing selection of output wavelength is shown in FIG. 6B, corresponding to the regions in FIG. 6A marked at ends of the waveguide. FIG. 6D shows a three-dimensional view of the laser system marking pumping region and illustrating output emission from the grating.

As described above, the array in this example is configured by a square lattice of ring resonators which are coupled to each other via link rings. The link rings are designed so as to be antiresonant to the main ring resonators. In this all-dielectric example, the intermediary links are spatially-shifted along the y-axis, with respect to the ring resonators, to introduce an asymmetric set of hopping phases. Spatial shifting of the links is selected to provide sequentially increased phase shift along the y-axis. The phase shift is increased in integer multiples of $\pm 2\pi\alpha$, where $\alpha=0.25$, generally $\alpha$ may be selected to be between 0.1 and 0.4. This configuration provides that a round trip along any plaquette (consisting of 4 rings and 4 links) results in a total accumulated phase of $\pm 2\pi\alpha$, where the sign depends on the direction of the path along this unit cell. This provides the lattice with a synthetic magnetic field and establishes two topologically non-trivial bandgaps as shown in FIGS. 5A and 5C.

The resonators 50 in this example are selected to have cross-section ensuring single transverse mode conditions at the wavelength of operation. More specifically, in this example, the laser system is operated between near Infrared to shortwave infrared wavelengths, and in this specific configuration to wavelength of 1550 nm. Accordingly, the resonator dimensions are 500 nm in width and 210 nm in height. The nominal separation between the ring-resonators and off-resonant links is 150 nm, thus leading to two frequency bandgaps, each having a width of 80 GHz (0.64 nm). The spectral size of the two bandgaps was obtained by experimentally using measurements of the frequency splitting (0.8 nm) in a binary system of primary resonators, linked via an intermediate links (in this example the links were configured as oval racetrack rings).

As described above, the laser system 100 includes a pumping unit 300, configured to provide pumping of at least a group of the optical elements of the array. In this example, the resonators 50 of the array are optically pumped to promote lasing of the topological (protected) edge-mode. The optical pumping utilizes optical illumination at wavelength of 1064 nm using pulses of 10 nanoseconds, and is directed at peripheral resonators. Generally, the group of optical elements/resonators that are under pumping conditions may include elements along at least a portion of the periphery of the array and may have width of 1-4 optical elements into the bulk of the array. However, in some configuration only the outermost resonators undergo pumping. In the case of optical pumping, the optical pumping may utilize one or more amplitude masks having selected spatial configuration in accordance with the array structure and selected pumping region.

As described above, to provide lasing activity, the laser system of the present invention utilizes a pumping unit configured for pumping a region of the array, typically selected in accordance with spatial arrangement of the topological mode, more specifically, the periphery/boundary of the topological array. Reference is made to FIG. 7 including FIGS. 7A to 7D and illustrating measured data relating to output intensity vs. pump density for the 10×10 topological array with $\alpha=0.25$ and its corresponding trivial counterpart where $\alpha=0$ indicating no shift between links (FIG. 7A); emission spectra from a trivial and a topological array when pumped at 23.5 kW/cm$^2$ (FIG. 7B); and Evolution of the spectrum as a function of the pumping intensity for topological (FIG. 7C) and trivial (FIG. 7D) arrays. The results of FIG. 7A show three-fold enhancement of the slope efficiency for the topological array with respect to the trivial array. Further the results shown in FIG. 7C clearly indicate single-mode, narrow-linewidth lasing from the array of the laser system.

The measured light-light curves of FIG. 7A for the topological and the trivial arrays show that the topological system lases with a higher efficiency than its trivial counterpart. The measured spectra of FIG. 7B to 7D illustrate that the laser system utilizing the topological arrays provides optical emission having single-mode over a wide range of pumping densities as shown in FIG. 7C. This is while the trivial arrays emit in multiple wavelengths with considerably broader linewidths as shown in FIG. 7D. Generally, comparing the power emitted in the dominant (longitudinal) lasing mode, the topological array provides better performance with respect to those of the trivial array by more than an order of magnitude. This difference in performance is attributed to the physical properties of the topological edge-modes. This is provided by the mode selection of the topological mode, providing single (or double) modes participating in lasing as well as robustness to imperfections such as disorder and defects. This is while in the trivial array the lasing modes extend into the lossy bulk (given peripheral pumping configuration) causing suppressed emission. Additionally, the use of an output coupler causes the trivial lasing modes to avoid the regions associated with coupler as it induces loss to adjacent modes. Moreover, interactions between modes provided by the gain material transmit light between the modes of the trivial array thus resulting in multi-mode behavior of the trivial array.

It should be noted that generally, the topological modes have certain exponential penetration into the bulk. However, the array of optical elements (cavities, resonators 50) configured according to the present invention provide topological edge-states that are strongly confined to the peripheral boundary of the array, maintaining the topological nature of these states in presence of nonlinear interaction provided by the saturable gain material. Further, as the topological modes are edge bound in nature, the lasing modes are always in contact with the output coupler 60, allowing greater output ratio with respect to any conventional laser system. Also, as described above, the topological lasing modes provide the laser system immunity to disorder and defects, as the topological modes are non-local and uniformly extend around the perimeter (in single mode). This enables the use of all the available gain in the system by suppressing any other parasitic mode.

These features of the topological lasing modes are illustrated in FIGS. 8 and 9 showing experimental results comparing emission of the topological array according to some embodiments of the invention with respect to trivial array configuration. FIG. 8 shows spectral content variation in different location on array periphery for trivial (FIG. 8A) and topological (FIG. 8E) arrays; and emission variation for full (FIGS. 8B and 8F) and partial (FIGS. 8C and 8D for trivial array and FIGS. 8G and 8H for topological array) pumping profile. FIGS. 9A and 9B show variation of the topological mode (FIG. 9A) and boundary modes in trivial array (FIG. 9B) in response to edge defects.

These results demonstrate topological features of the array and thus provide effective lasing operation for the laser system according to some embodiments of the invention. Variations of the spectrum of light emitted from different regions of the array, shown in FIGS. 8A and 8E, provides indication to localization or global nature of the lasing modes around the perimeter of the array. For the trivial array, the spectrum varies around the lattice, with emission occurring over a wide wavelength range spanning from 1543 nm to 1570 nm, as shown in FIG. 8A. This illustrates lasing activity in localized domains as expected in general arrays. However, FIG. 8E shows constant emission spectrum along periphery of the array. More specifically, at each point along the perimeter of the array, the emission is provided with similar wavelength. This indicates single mode lasing corresponding to a single extended topological edge mode, and providing a direct manifestation of topologically-protected transport.

Partial pumping, as illustrated in FIGS. 8B to 8D and 8F to 8H illustrate additional topological transport characteristics. As shown, in the topological configuration, the laser activity is maintained under partial pumping (pumping of only a region of the perimeter. More specifically, in FIGS. 8B and 8F the entire perimeter of the array in pumped, providing high laser efficiency for the topological configuration and certain laser activity for the trivial array configuration. FIGS. 9C and 9G, illustrate pumping of only half of the perimeter. Such partial pumping stops any laser operation in the trivial array of FIG. 8C, but the laser operation of the topological array is maintained as shows in FIG. 8G. This behavior continues with pumping of only one of the array edges (corresponding to ¼ of the preferred pumping region). In partial pumping of laser array, the emission is heavily suppressed both in the bulk as well as along the perimeter reducing light intensity along the perimeter. However, the topological array maintains light propagation along the perimeter providing optical emission, although it may be somewhat reduced, only one of the output coupler gratings provides strong emission This shows that the topological lasing modes extend around the perimeter, and travels all the way to the output ports. The inventors have found similar results in experimental testing of a number of samples, indicating that these results are not affected by manufacturing imperfections and are associated with topological modes provided by the array configuration and pumping configuration.

Robustness to defects is shown in the experimental results of FIGS. 9A and 9B. Two selected resonators were removed the perimeter of a topological array (FIG. 9A) and trivial array (FIG. 9B). Emission from the arrays was measured under pumping. As shown from the light emission of the topological configuration, the topological lasing modes bypasses the defect and maintains lasing operation, while in the trivial array, the intensity of the emitted light is considerably subdued.

As indicated above, nonlinearity associated with saturated gain interacting with light propagating in the array of the laser system according to the present invention may cause interaction between CW and CCW topological modes. In this connection, reference is made to FIG. 10 illustrating the use of S-ring resonators as active resonators 50 in the array of the laser system according to some examples of the present invention. In this example, the resonators (50) of the array further include an internal "S" shaped waveguide and thus brake reciprocity by differentiating between the CW and CCW modes.

Figure 10D:
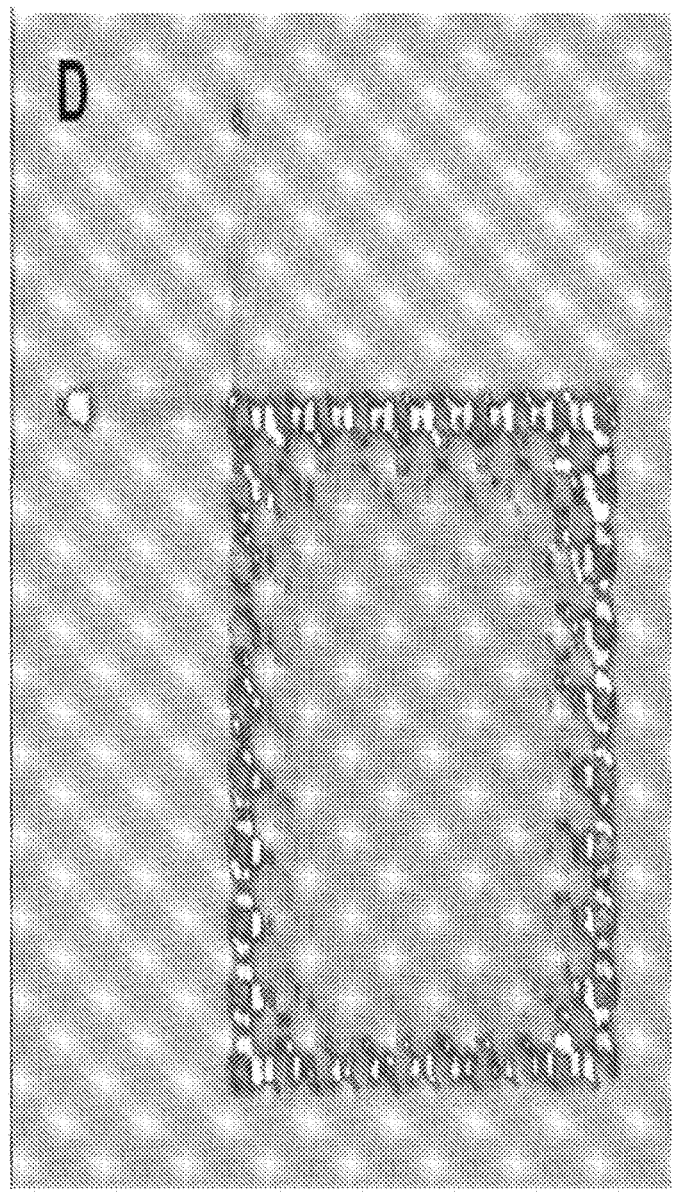

The general array configuration is similar to that exemplified in FIG. 4 with the main resonators replaced by S-ring resonators and the intermediary links remain similar (having shift between links of different rows to provide the desired phase shift). The S-ring resonators provide selective single spin-like manner, i.e. in either the CW or the CCW direction is supported by the resonator, where the other mode is suppressed. FIG. 10A shows microscopic image of the array utilizing S-ring resonators; FIG. 10B shows an enlarged region of the array; FIG. 10C shows a single S-ring resonator; and FIG. 10D shows experimental measurement laser emission with perimeter pumping scheme as described above. As shown in FIG. 10D, selectivity of the S-rind resonators between CW and CCW modes provides emission from only one of the output grating. This is due to suppression of topological modes travelling in one direction and allowing lasing activity in topological mode selected by chirality of the S-Ring resonators.

Generally, the S-ring resonators are chiral elements that, in the presence of nonlinearity associated with gain saturation, allow unidirectionality to the topological protection of transport. The suppression observed in the experiments is larger than 12 dB suppression between the CW and CCW modes within the resonator (often referred to as right- and left-hand spins in each resonator). The field distribution within the S-ring resonators is shown in FIG. 10C illustrating high degree of power-recirculation through the S-structure that typically provides the spin-like mode discrimination.

Figure 11:
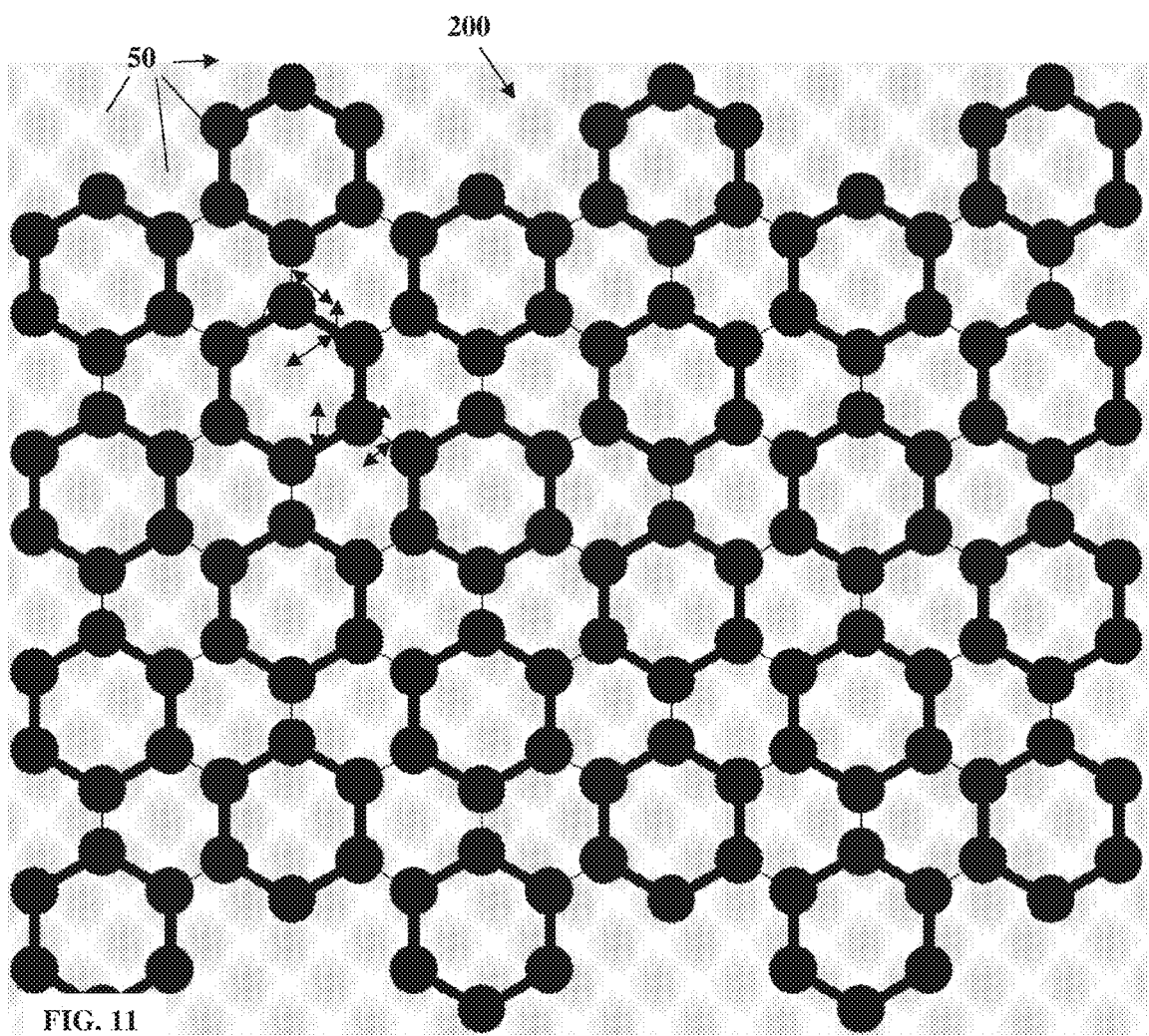
FIG. 11 illustrates an array of optical resonators suitable for supporting topological modes utilizing only array configuration and suitable for use in laser system according to some embodiments of the invention.

Reference is made to FIG. 11 illustrating additional array configuration that may be used for the laser system according to some embodiments of the invention. In this example, the laser system includes an array 200 of optical resonators 50 (optical cavities or ring resonators) arranged in honeycomb lattice having two different coupling constants between neighboring resonators. For example, the resonators 50 are arranged with distance D1 between resonators of hexagonal arrangement H1 and with distance D2, longer than distance D1, in hexagonal arrangement H2. This array configuration provides stronger coupling between neighboring resonators 50 within the arrangement H1, while weaker coupling between the different H1 arrangements. The resonators 50 include a plurality of resonators carrying gain material. More specifically, in some configurations all, or almost all of the resonators 50 of the array 200 are configured with gain material. In some other configurations, resonators 50 located along edges of the array 200, or forming a band of width of 2-5 resonators (or 1-2 hexagonal lattice units H1) from the edge of the array 200 are configured with gain material.

The laser system further includes pumping unit and at least one output port as exemplified in FIG. 1. The pumping unit is configured for providing pumping energy to a region along edges of the array 200 thereby providing pumping to one or more topological modes formed by the array configuration. The output port is coupled to one or more of the resonators 50 located along edges of the array 200 to provide output of laser emission from the array. As indicated above, the array 200 in this example is configured with varying distances D1 and D2 defining first lattice of resonator units 50 on top of a second lattice of hexagonal arrangement H1. Where coupling constants between the hexagonal arrangements H1 are smaller than coupling within each hexagonal arrangement H1. It should be noted that the resonators 50 in this array configuration may be strongly or weakly coupled between them. Moreover, coupling between the resonators 50 may be direct or utilize optical coupling links as exemplified in FIG. 4 above (while note requiring any shift between the links).

Figure 12:
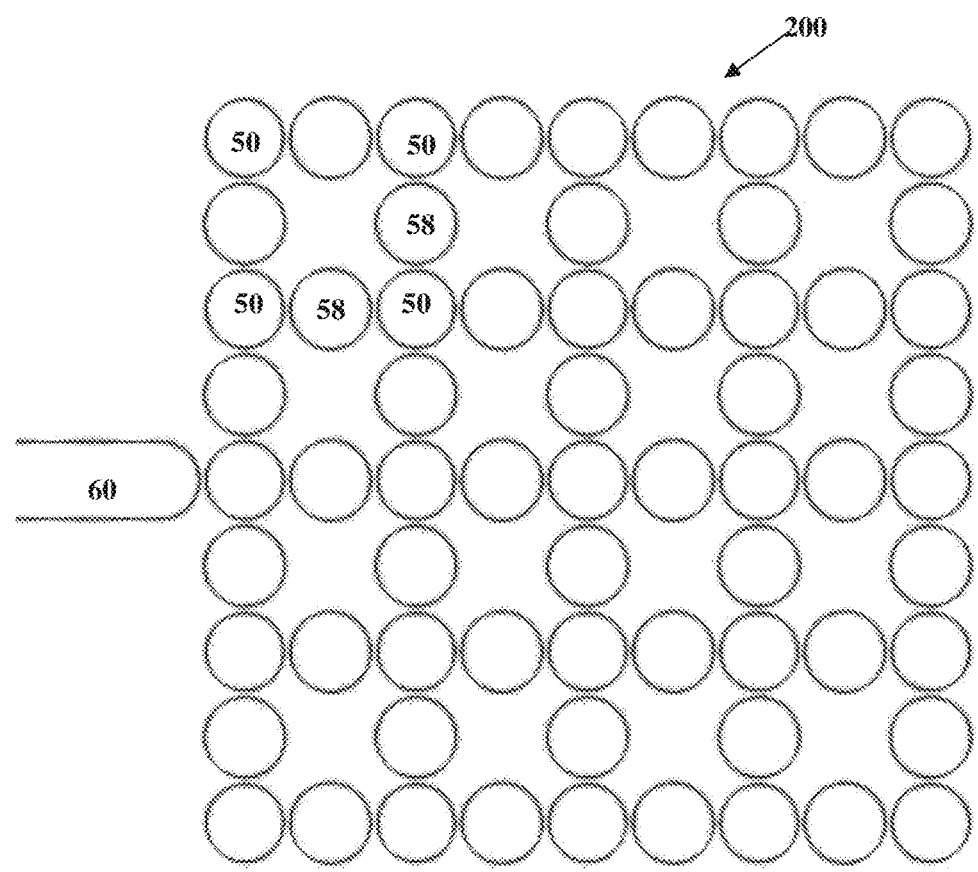
FIG. 12 illustrates an additional array configuration suitable for supporting topological modes utilizing only array configuration and suitable for use in laser system according to some embodiments of the invention.

Additional example of array configuration 200 of a laser system according to some embodiments of the invention is illustrates in FIG. 12. The array 200 is configured as rectangular array of resonators 50 coupled between them by optical link couplers 58. The link couplers 58 are selected with geometry and/or effective refractive index, to be out of resonant with respect to resonant frequency of the resonators 50. The resonators 50 are strongly coupled to their neighboring link couplers 58 at frequency range around the resonant frequency of the resonators 50, such that light is transmitted between the resonators at high rate and the light intensity within the link couplers 58 is lower with respect to light intensity in the resonators 50. Similarly to the above described array configurations, the array 200 of FIG. 12 gives rise to topological edge modes. Accordingly, the plurality of resonators 50, and possibly some of the link couplers 58, are configured with gain material emitting light of wavelength corresponding with resonant frequency of the resonators 50. The laser system further includes pumping unit configured to provide pumping energy to edges of the array 200 (e.g. with width of 2-4 unit cells of the array) and one or more output ports 60 configured to coupled light out of the array to provide output of the laser system.

Accordingly, the present invention provides a laser system configured for utilizing one or more topologically protected lasing modes. The laser system is based on an array of coupled optical elements, such as resonators or cavities, carrying selected gain material, pumping unit configured to provide pumping energy to at least a group of the optical elements (typically along perimeter of the array), and an output port coupled to one or more of the optical elements and providing output emission from the laser system. The array of optical elements is configured with geometry and coupling arrangement between the elements to provide varying phase shift between light components coupled along a given path in one direction (e.g. clockwise) with respect to the other direction (e.g. counterclockwise), thus supporting one or more topological edge modes.

The topologically insulator laser system utilizes features of the topological modes to enhance the lasing performance. The laser configuration of the present invention enables the use of a 2D array of micro-resonators, to provide single mode laser operation that is robust to disorder and defects by extending topologically-protected scatter-free edge mode. The single longitudinal mode operation of the laser provides higher slope efficiency as compared to convention laser array configurations. Generally, in some embodiments, the laser system may be configured by contemporary fabrication technologies of semiconductor laser, without need for magnetic units of exotic materials.

The invention claimed is:

1. A laser system comprising:
   an array of optical elements configured as optical resonators comprising optical resonators comprising gain material, the optical resonators of the array are optically coupled between them and are spatially arranged supporting at least one topological mode associated with certain spatial region of the array, said array comprising at least two optical links coupling between said optical resonators of the array, said optical links being accommodated with selected spatial shifts with respect to an axis between corresponding optical resonators, said shifts varying between different rows of the array, thereby providing phase difference associated with two optical paths connecting said optical resonators through the links;
   a pumping unit configured to provide pumping of a group of the optical resonators of the array within at least a portion of the spatial region corresponding with said topological mode; and
   at least one output port optically coupled to one or more of the optical resonators associated with said topological mode, said at least one output port being configured for extracting a portion of light intensity from said laser system.

2. The laser system of claim 1, wherein said array of optical the elements is configured as a photonic crystal having a band structure associated with photonic states within said photonic crystal, said band structure comprising one or more photonic states crossing a gap between bands of the photonic states; said one or more photonic states crossing said gap correspond with the at least one topological mode within the array.

3. The laser system of claim 1, wherein said array is a two-dimensional array, said at least one topological mode being associated with at least one edge states travelling along periphery of said array.

4. The laser system of claim 1, wherein said optical elements are arranged with spatial variation between them providing phase shift to light components coupled between the rows of the array in one direction different with respect to opposite direction.

5. The laser system of claim 1, wherein coupling between said optical elements of the array is configured such that coupling between optical elements of different rows introduce selected phase shift to light coupling in one direction and different phase shift to light coupling in the opposite direction.

6. The laser system of claim 1, wherein said optical resonators are ring resonators.

7. The laser system of claim 1, wherein said optical resonators comprise at least one helical portion.

8. The laser system of claim 1, where said shifts in location of the optical links vary by predetermined step level between different rows of the array.

9. The laser system of claim 1, wherein said array has lattice geometry selected from: rectangular, hexagonal, honeycomb or having a triangular lattice of sub-array units where each unit is formed by honeycomb lattice.

10. The laser system of claim 1, wherein said gain material comprises at least one Nitride compound.

11. The laser system of claim 10, wherein said Nitride compound comprises at least one Gallium containing layer.

12. The system of claim 1, wherein said at least one output port comprises at least one optical fiber arranged along a selected and wherein a region of said optical fiber is positioned in close proximity to at least one optical element located at edge of the array to thereby enable out coupling of optical emission from one or more topological modes of the array.

13. A laser system, comprising:
   an array of optical elements configured as optical resonators comprising optical resonators comprising gain material, the optical elements of the array being optically coupled between them and spatially arranged supporting at least one topological mode associated with certain spatial region of the array, wherein said array is configured as a two-dimensional array, said array comprising a plurality of optical links coupling between adjacent optical resonators, optical links of different rows of the array being shifted with respect to optical links of neighboring rows by a predetermined shift, thereby providing predetermined shift in phase accumulation of light passing through said links in clockwise or counterclockwise directions;
   a pumping unit configured to provide pumping of a group of the optical elements of the array within at least a portion of the spatial region corresponding with said topological mode; and
   at least one output port optically coupled to one or more of the optical elements associated with said topological mode, said at least one output ports being configured for extracting a portion of light intensity from said laser system.

14. The laser system of claim 13, characterized by at least one of the following:
   said optical resonators are ring resonators;
   said optical resonators comprise at least one helical portion;
   said array has lattice geometry selected from: rectangular, hexagonal, honeycomb or having a triangular lattice of sub-array units where each unit is formed by honeycomb lattice;
   said gain material comprises at least one Nitride compound;
   said at least one output port comprises at least one optical fiber arranged along a selected and wherein a region of said optical fiber is positioned in close proximity to at least one optical element located at edge of the array to thereby enable out coupling of optical emission from one or more topological modes of the array.

15. A laser system, comprising:
   an array of optical elements configured as optical resonators comprising optical resonators comprising gain material, the optical elements of the array being optically coupled between them and spatially arranged supporting at least one topological mode associated with certain spatial region of the array, wherein said optical resonators are directly coupled between them, and wherein at least one of internal resonator geometry and coupling between neighboring resonators is varied along the array providing an optical topological mode;
   a pumping unit configured to provide pumping of a group of the optical elements of the array within at least a portion of the spatial region corresponding with said topological mode; and
   at least one output port optically coupled to one or more of the optical elements associated with said topological mode, said at least one output ports being configured for extracting a portion of light intensity from said laser system.

16. The laser system of claim 15, characterized by at least one of the following:
   said optical resonators are ring resonators;
   said optical resonators comprise at least one helical portion;
   said array has lattice geometry selected from: rectangular, hexagonal, honeycomb or having a triangular lattice of sub-array units where each unit is formed by honeycomb lattice;
   said gain material comprises at least one Nitride compound;
   said at least one output port comprises at least one optical fiber arranged along a selected and wherein a region of said optical fiber is positioned in close proximity to at least one optical element located at edge of the array to thereby enable out coupling of optical emission from one or more topological modes of the array.

17. A laser system, comprising:
   an array of optical elements configured as optical resonators comprising optical resonators comprising gain material, the optical elements of the array being optically coupled between them and spatially arranged supporting at least one topological mode associated with certain spatial region of the array, wherein said optical resonators are arranged in a hexagonal array forming first hexagonal arrangements characterized first coupling constant within the hexagonal arrangement and a second coupling constant, lower with respect to the first coupling constant between neighboring hexagonal arrangements;
   a pumping unit configured to provide pumping of a group of the optical elements of the array within at least a portion of the spatial region corresponding with said topological mode; and
   at least one output port optically coupled to one or more of the optical elements associated with said topological mode, said at least one output ports being configured for extracting a portion of light intensity from said laser system.

18. The laser system of claim 17, characterized by at least one of the following:
   said optical resonators are ring resonators;
   said optical resonators comprise at least one helical portion;
   said gain material comprises at least one Nitride compound;
   said at least one output port comprises at least one optical fiber arranged along a selected and wherein a region of said optical fiber is positioned in close proximity to at least one optical element located at edge of the array to thereby enable out coupling of optical emission from one or more topological modes of the array.

19. A laser system, comprising:
   an array of optical elements configured as optical resonators comprising optical resonators comprising gain material, the optical elements of the array being optically coupled between them and spatially arranged supporting at least one topological mode associated with certain spatial region of the array, wherein said optical resonators are characterized by first resonant frequency, said array comprising a plurality of link couplers located between neighboring resonators of the array to provide coupling between them, said link couplers having a second resonant frequency different than said first resonant frequency;
   a pumping unit configured to provide pumping of a group of the optical elements of the array within at least a portion of the spatial region corresponding with said topological mode; and
   at least one output port optically coupled to one or more of the optical elements associated with said topological mode, said at least one output ports being configured for extracting a portion of light intensity from said laser system.

20. The laser system of claim 19, wherein said link couplers are positioned to be strongly coupled to neighboring resonators at said first resonant frequency.

21. The laser system of claim 19, characterized by at least one of the following:
   said optical resonators are ring resonators;
   said optical resonators comprise at least one helical portion;
   said array has lattice geometry selected from: rectangular, hexagonal, honeycomb or having a triangular lattice of sub-array units where each unit is formed by honeycomb lattice;
   said gain material comprises at least one Nitride compound;
   said at least one output port comprises at least one optical fiber arranged along a selected and wherein a region of said optical fiber is positioned in close proximity to at least one optical element located at edge of the array to thereby enable out coupling of optical emission from one or more topological modes of the array.

* * * * *